(12) United States Patent
Sooriakumar et al.

(10) Patent No.: US 11,902,741 B2
(45) Date of Patent: Feb. 13, 2024

(54) CAPACITIVE MICROPHONE SENSOR DESIGN AND FABRICATION METHOD FOR ACHIEVING HIGHER SIGNAL TO NOISE RATIO

(71) Applicants: Innogrity Pte Ltd, Singapore (SG); Kathirgamasundaram Sooriakumar, Rochester, NY (US); Anu Austin, Singapore (SG); Ian Rose Bihag, Cebu (PH)

(72) Inventors: Kathirgamasundaram Sooriakumar, Rochester, NY (US); Anu Austin, Singapore (SG); Ian Rose Bihag, Cebu (PH); Boon Wah Soh, Singapore (SG); Jane Jiaying Soh, Singapore (SG)

( * ) Notice: Subject to any disclaimer, the term of this patent is extended or adjusted under 35 U.S.C. 154(b) by 0 days.

(21) Appl. No.: 17/978,021

(22) Filed: Oct. 31, 2022

(65) Prior Publication Data
US 2023/0054811 A1 Feb. 23, 2023

Related U.S. Application Data

(62) Division of application No. 16/797,452, filed on Feb. 21, 2020, now Pat. No. 11,523,224.

(51) Int. Cl.
*H04R 19/04* (2006.01)
*H04R 1/04* (2006.01)
(Continued)

(52) U.S. Cl.
CPC ........... *H04R 19/04* (2013.01); *B81B 3/0086* (2013.01); *B81C 1/00698* (2013.01); *H04R 1/04* (2013.01);
(Continued)

(58) Field of Classification Search
CPC . H04R 19/04; H04R 7/04; H04R 1/04; H04R 31/003; H04R 2201/003
See application file for complete search history.

(56) References Cited

U.S. PATENT DOCUMENTS

| 5,381,299 A | 1/1995 | Provenzano et al. |
| 2004/0130243 A1 | 7/2004 | Buhler et al. |

(Continued)

FOREIGN PATENT DOCUMENTS

| CN | 206932407 U | 1/2018 |
| CN | 209897272 U | 1/2020 |

(Continued)

*Primary Examiner* — Sunita Joshi
(74) *Attorney, Agent, or Firm* — Cozen O'Connor

(57) ABSTRACT

A capacitive transducer or microphone includes a first substrate of one or more layers and which includes a first surface, a first cavity in the first surface, and a mesa diaphragm that spans the first cavity. The capacitive transducer or microphone includes a second substrate fixed to the first substrate. The second substrate has one or more layers which includes a second cavity having a nonplanar (e.g., contoured or structured or stepped) bottom surface that faces the mesa diaphragm. A shape or relief of the bottom surface of the cavity may advantageously be, to at least some degree, complementary to a deformed shape of the diaphragm. The second substrate may include one or more acoustic holes, non-uniformly distributed thereacross. One or more vents may vent the second cavity.

25 Claims, 16 Drawing Sheets

(51) Int. Cl.
  *H04R 31/00* (2006.01)
  *H04R 7/04* (2006.01)
  *B81B 3/00* (2006.01)
  *B81C 1/00* (2006.01)

(52) U.S. Cl.
  CPC ............ *H04R 7/04* (2013.01); *H04R 31/003* (2013.01); *B81B 2201/0257* (2013.01); *B81B 2203/0127* (2013.01); *B81B 2203/0315* (2013.01); *B81B 2203/0353* (2013.01); *B81B 2207/07* (2013.01); *B81C 2203/036* (2013.01); *H04R 2201/003* (2013.01)

(56) References Cited

U.S. PATENT DOCUMENTS

| | | |
|---|---|---|
| 2012/0189152 A1 | 7/2012 | Reinmuth |
| 2017/0241855 A1* | 8/2017 | Sooriakumar ....... H05K 3/4038 |
| 2019/0082270 A1 | 3/2019 | Sun |

FOREIGN PATENT DOCUMENTS

| | | |
|---|---|---|
| CN | 108124226 B | 9/2021 |
| EP | 1244332 A2 | 9/2002 |
| TW | 200738028 A | 10/2007 |

\* cited by examiner

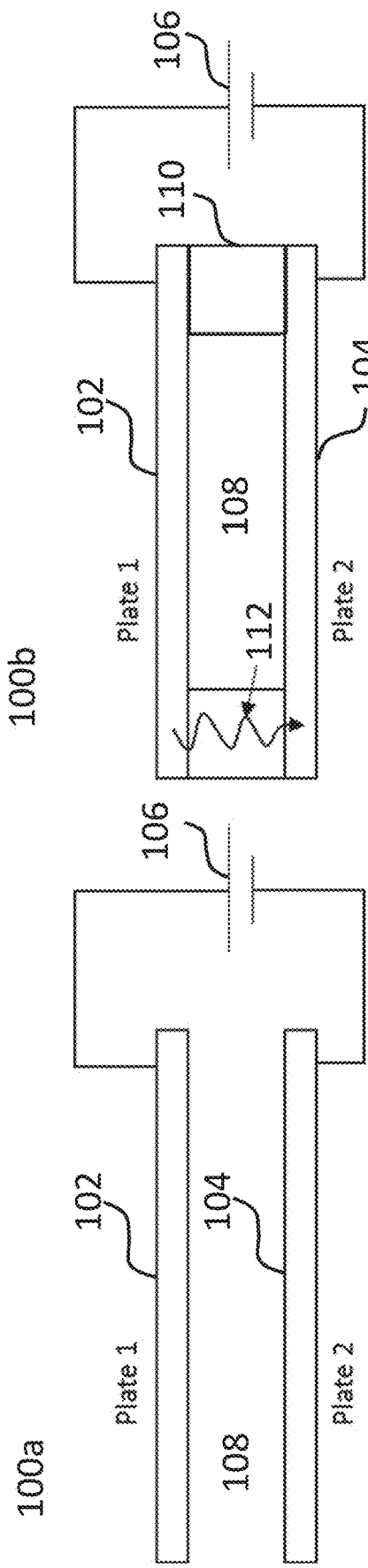
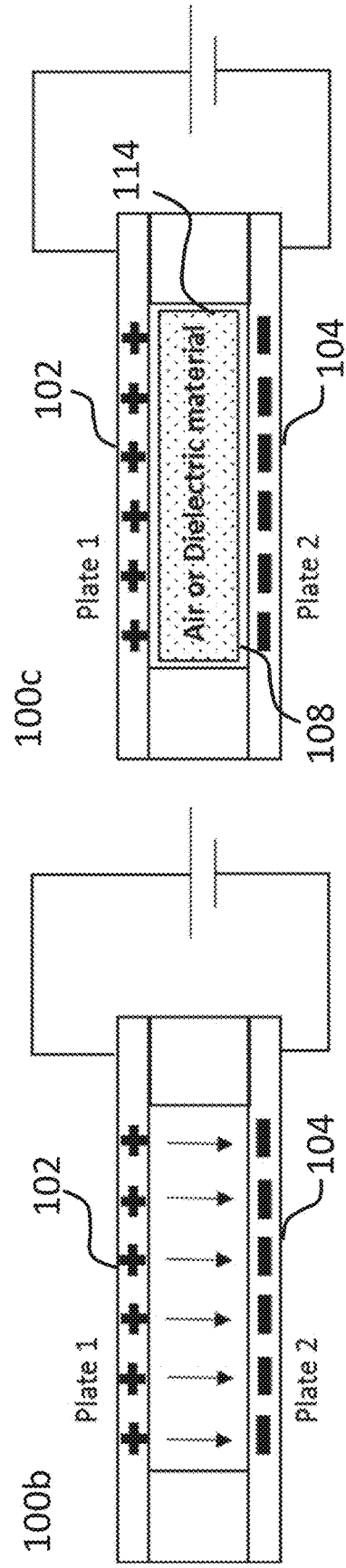

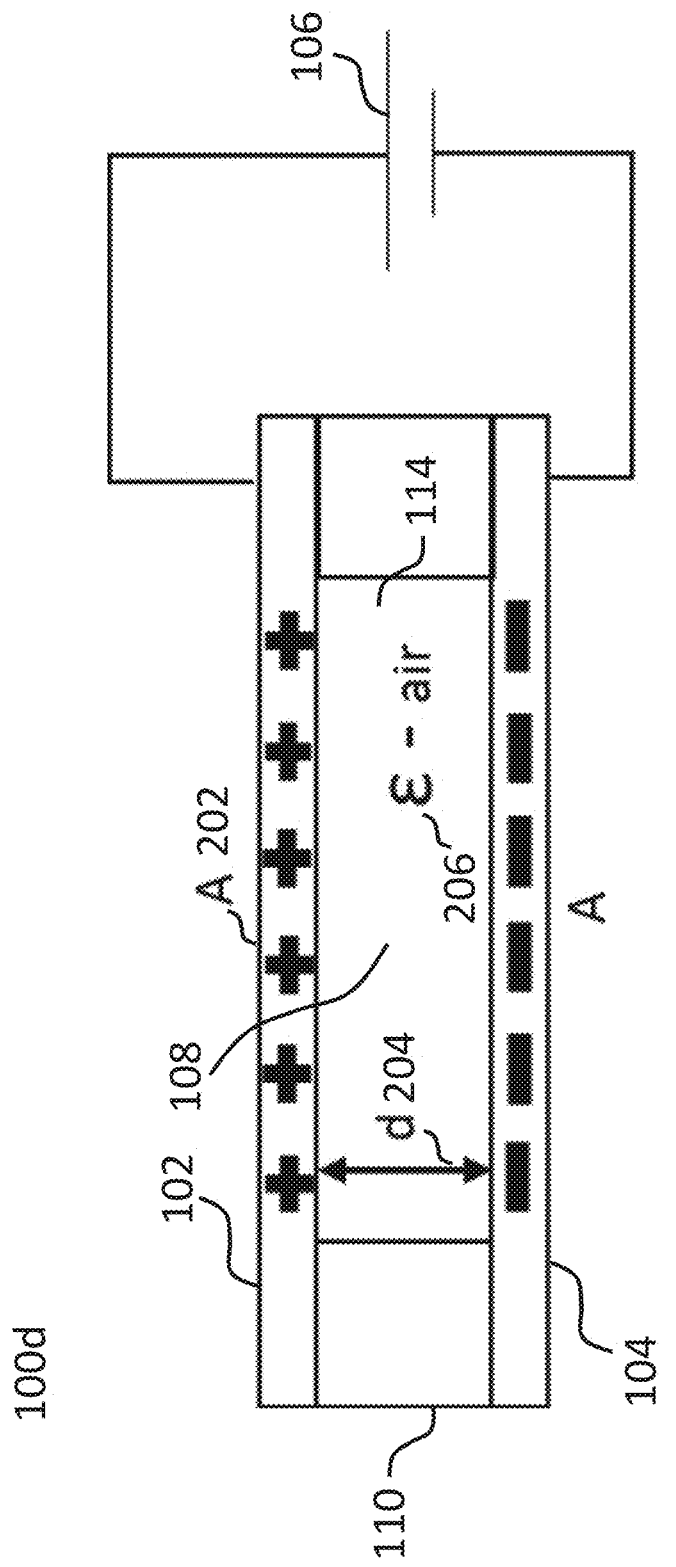
FIG. 5 capacitor configuration. $C=\varepsilon A/d$

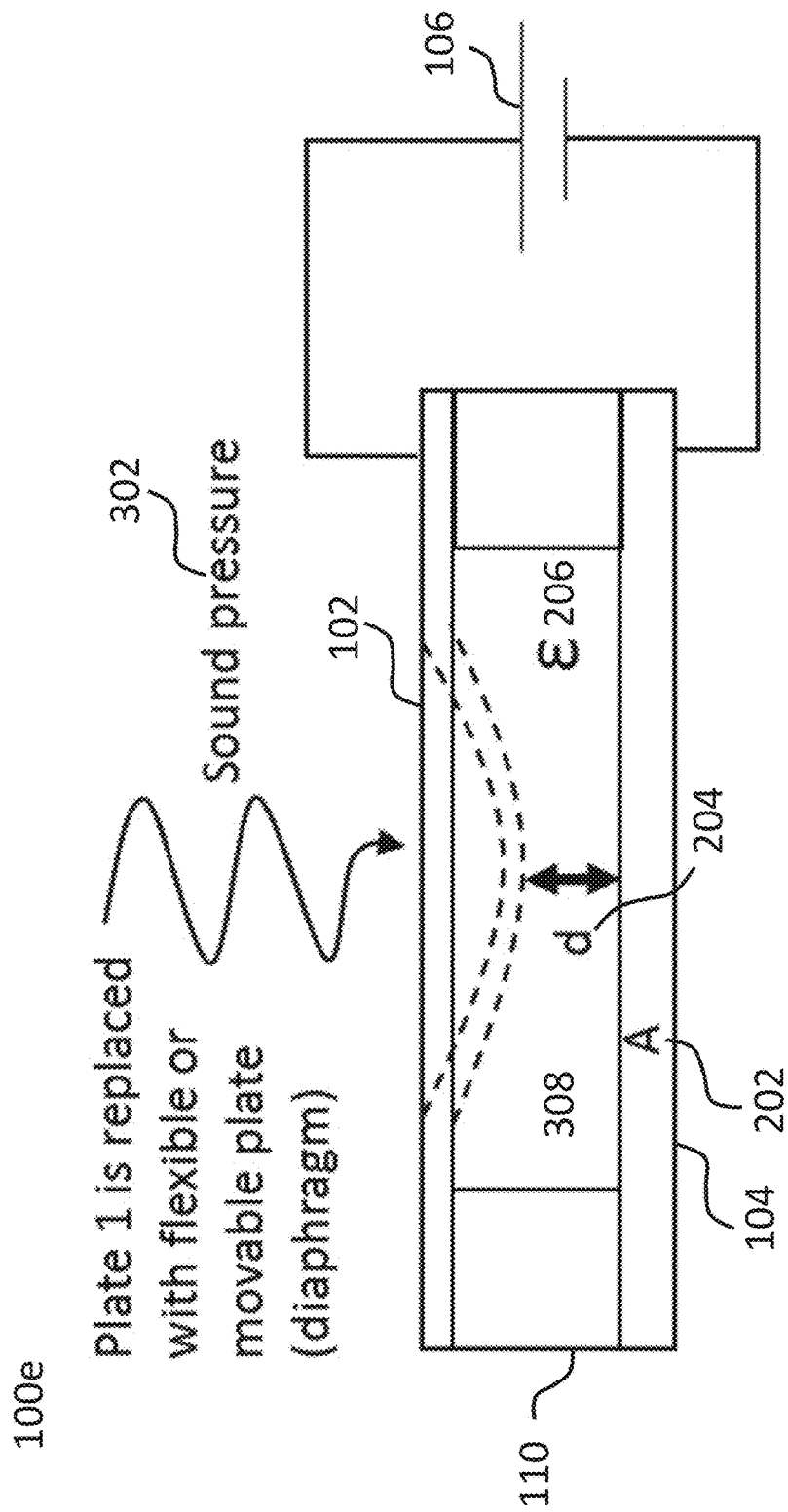
FIG. 6 Capacitor transformed into capacitive sensing device
$C = \varepsilon A/d$; wherein
A 202 is surface area
d 204 is distance between two plates
$\varepsilon$ 206 is permittivity

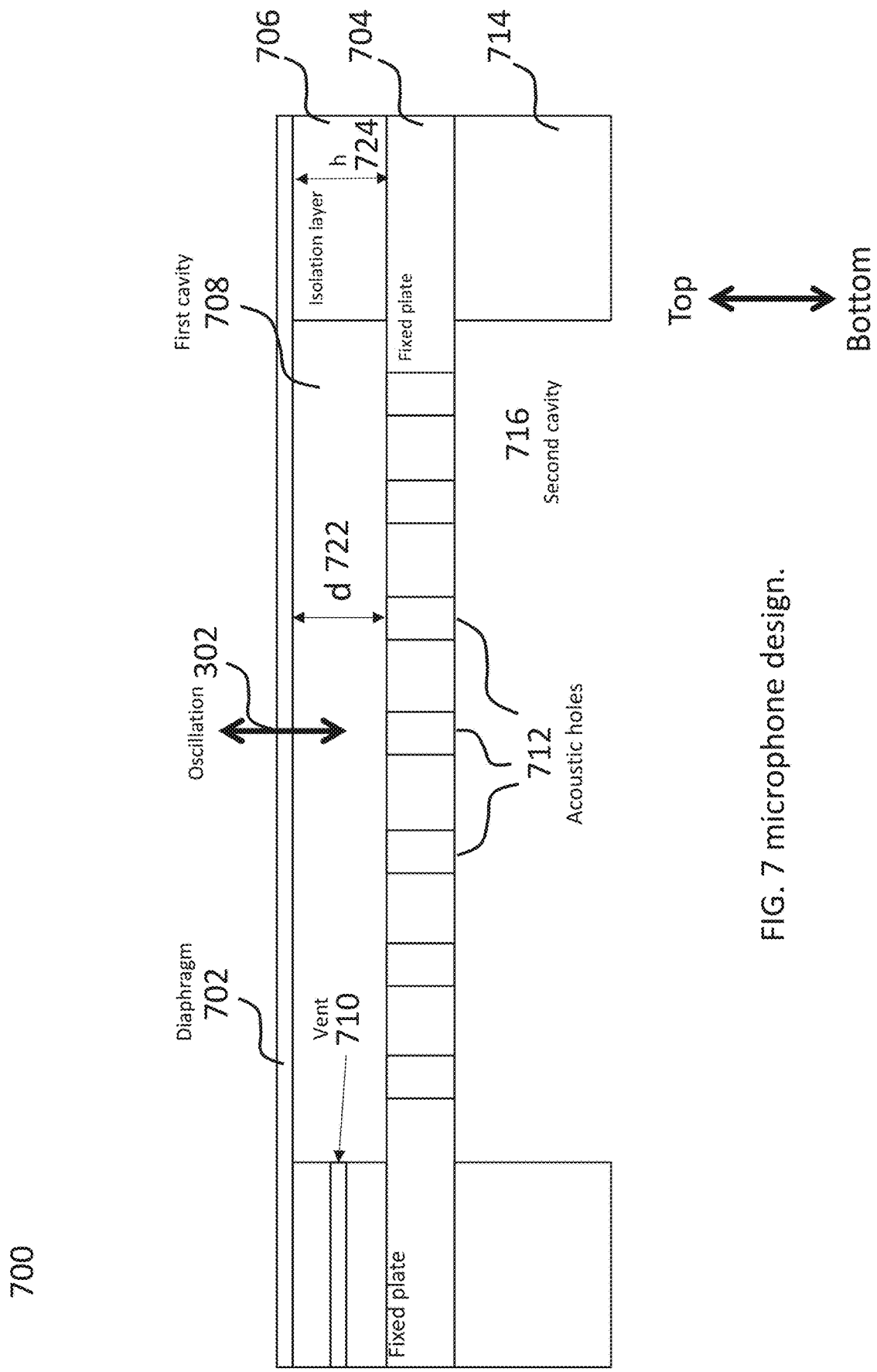
FIG. 7 microphone design.

Mesa diaphragm fabrication method

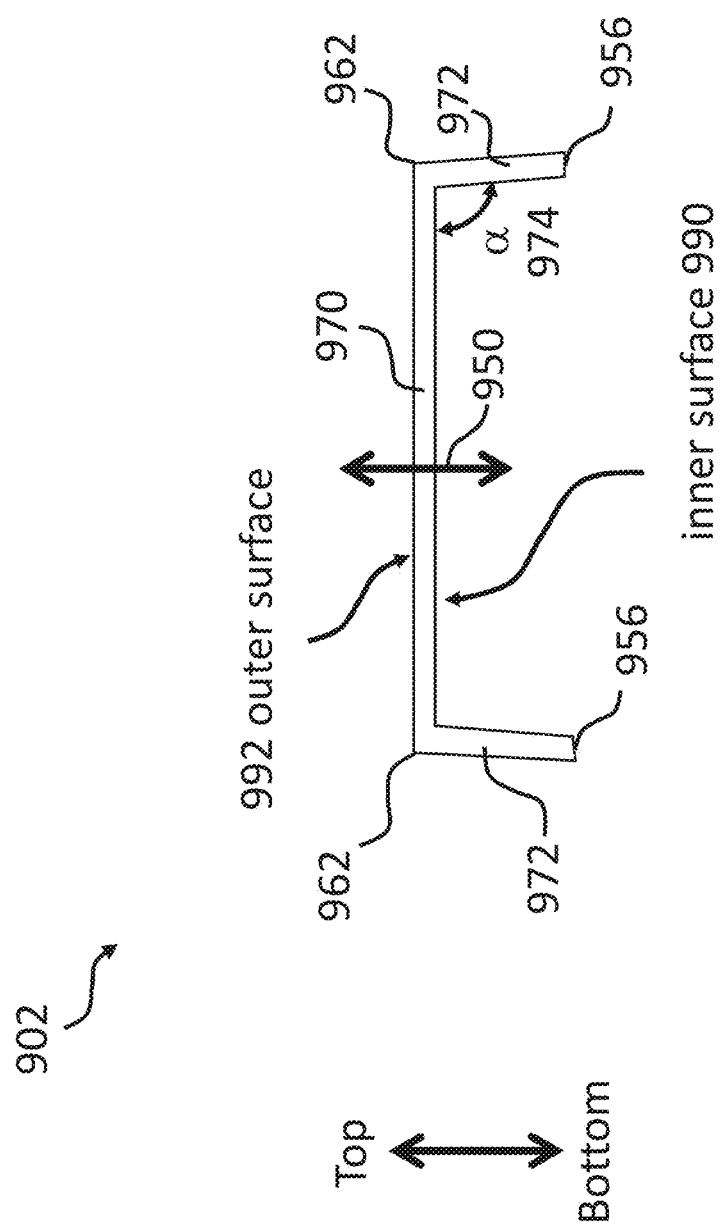
FIG. 9A. A sectional view of a MESA diaphragm

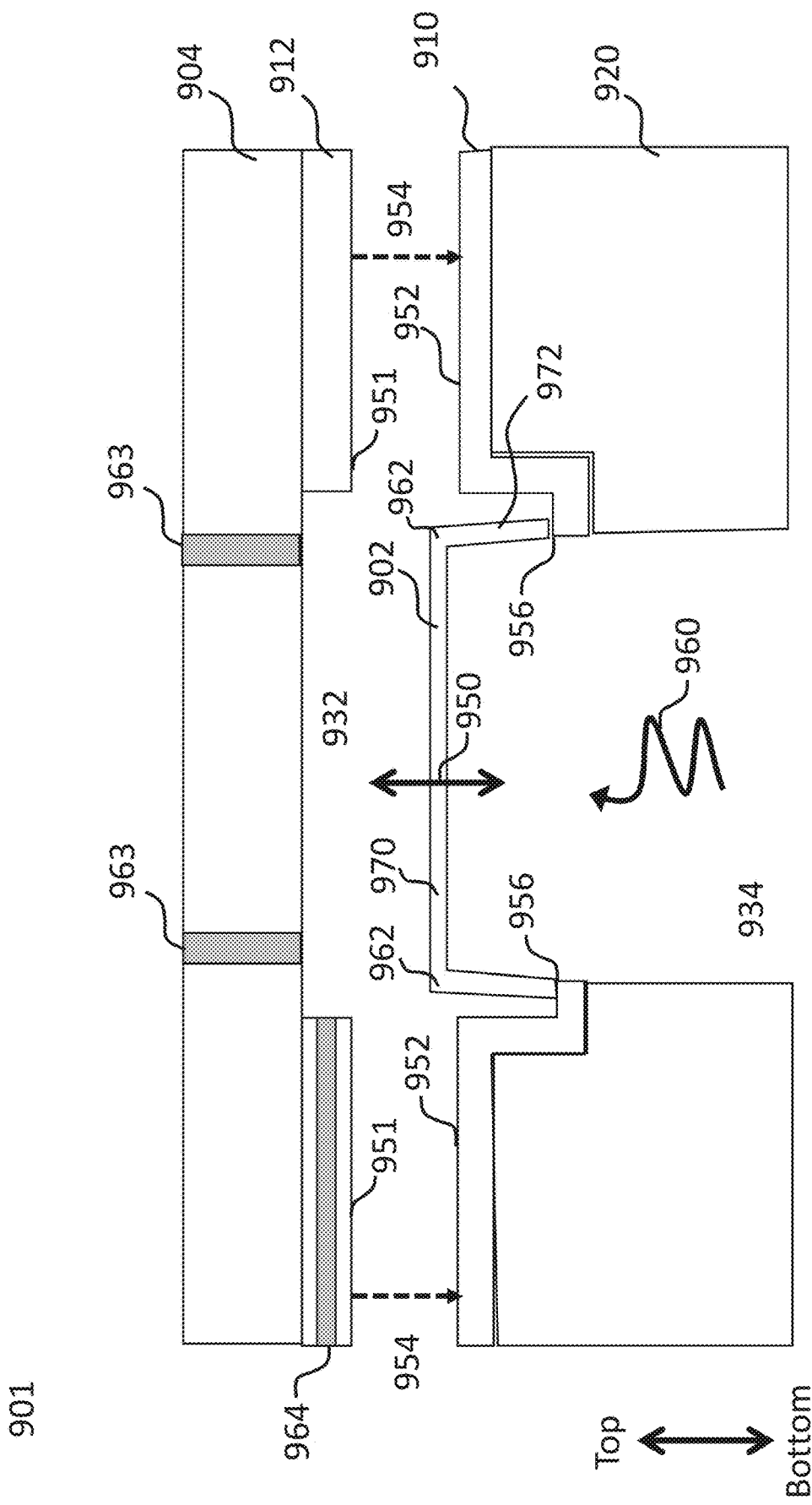
FIG.9B. A sectional view of a microphone structure that has a mesa diaphragm

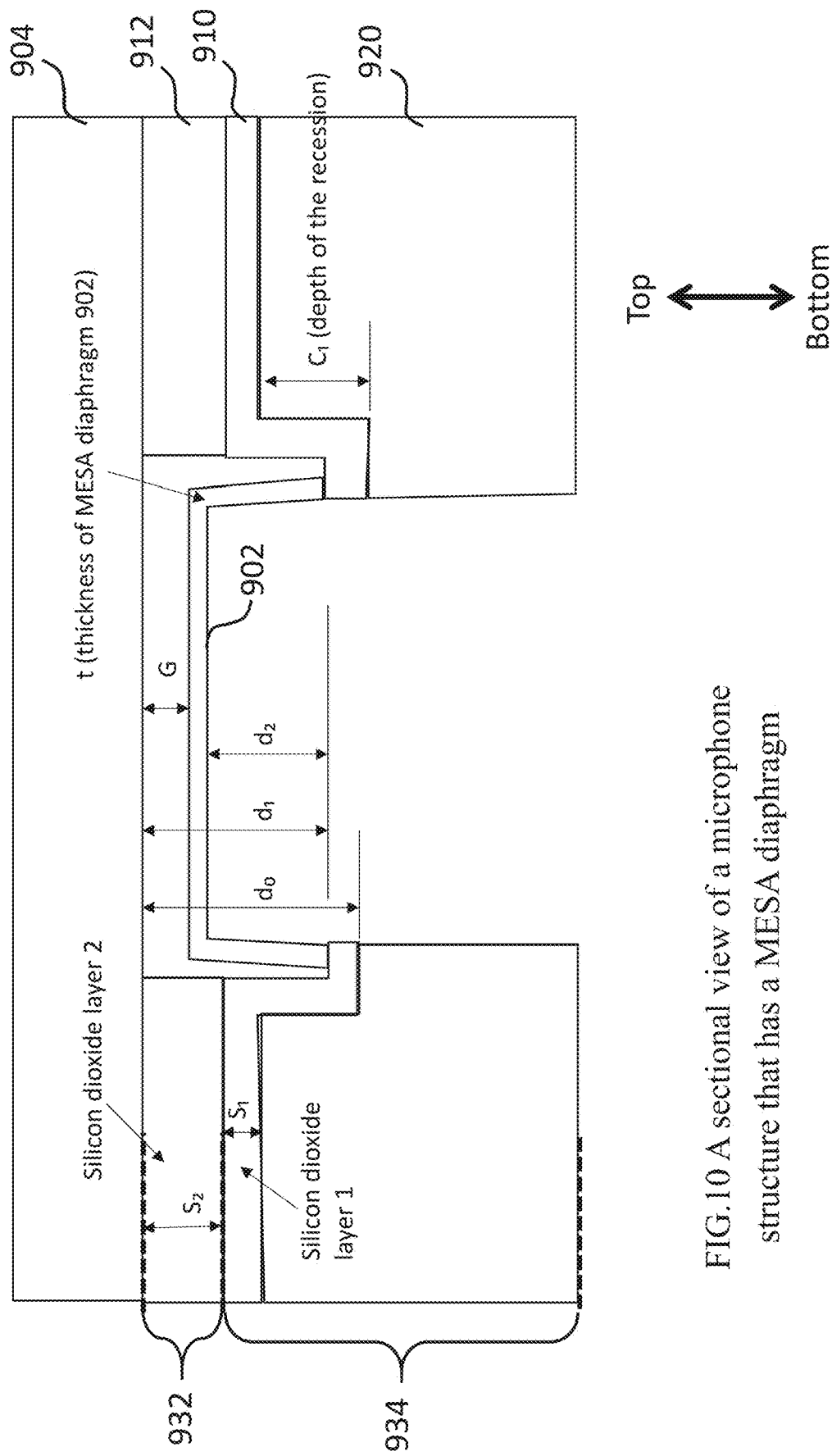
FIG. 10 A sectional view of a microphone structure that has a MESA diaphragm

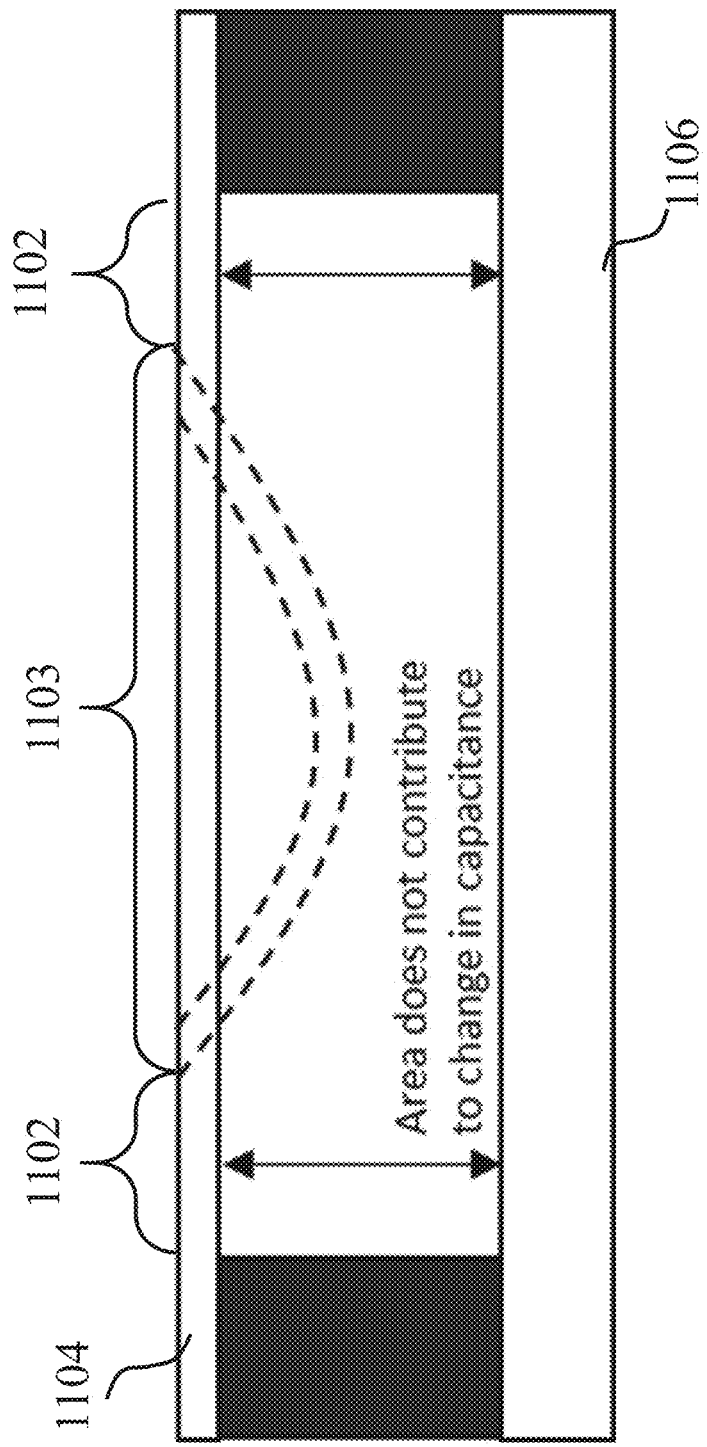
FIG. 11. A sectional view of a box cavity design.

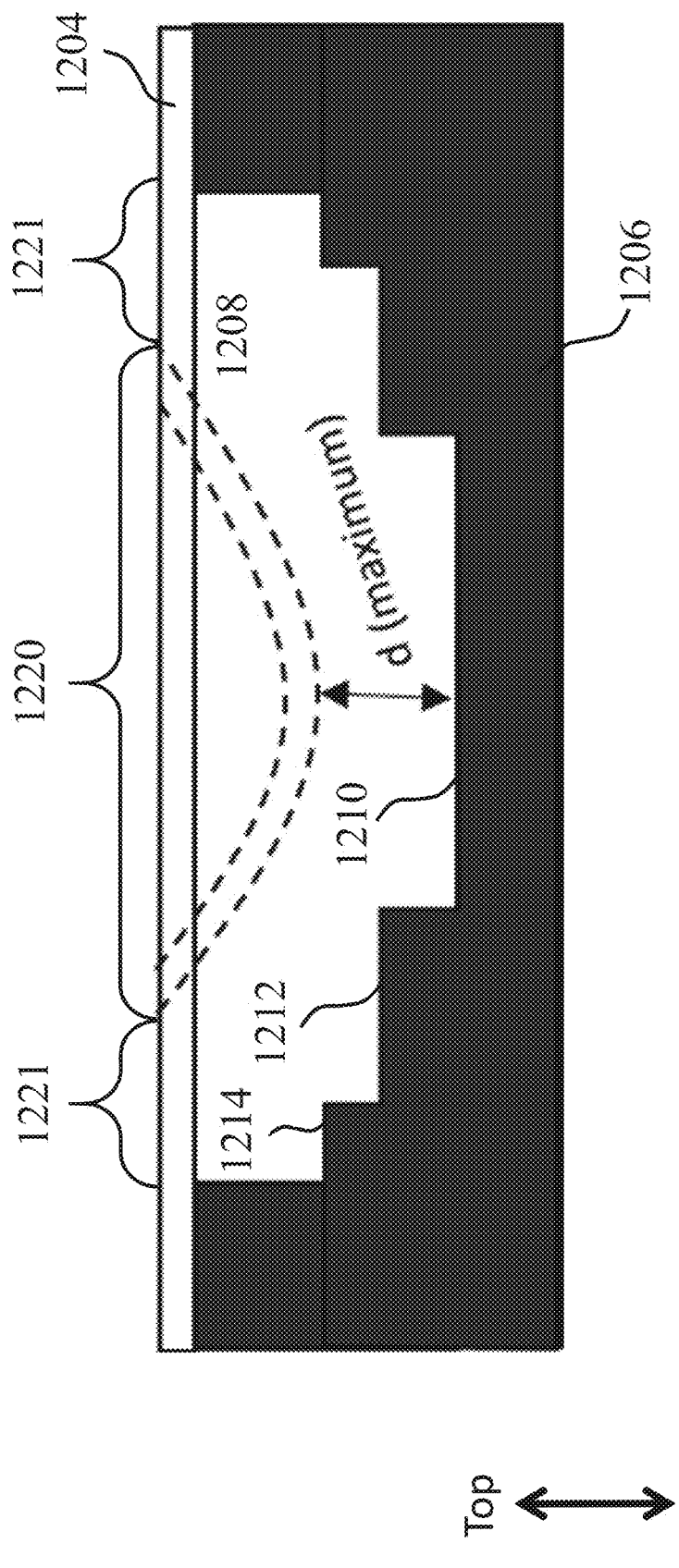
FIG. 12. A sectional view of a contour (e.g., stepped) cavity design.

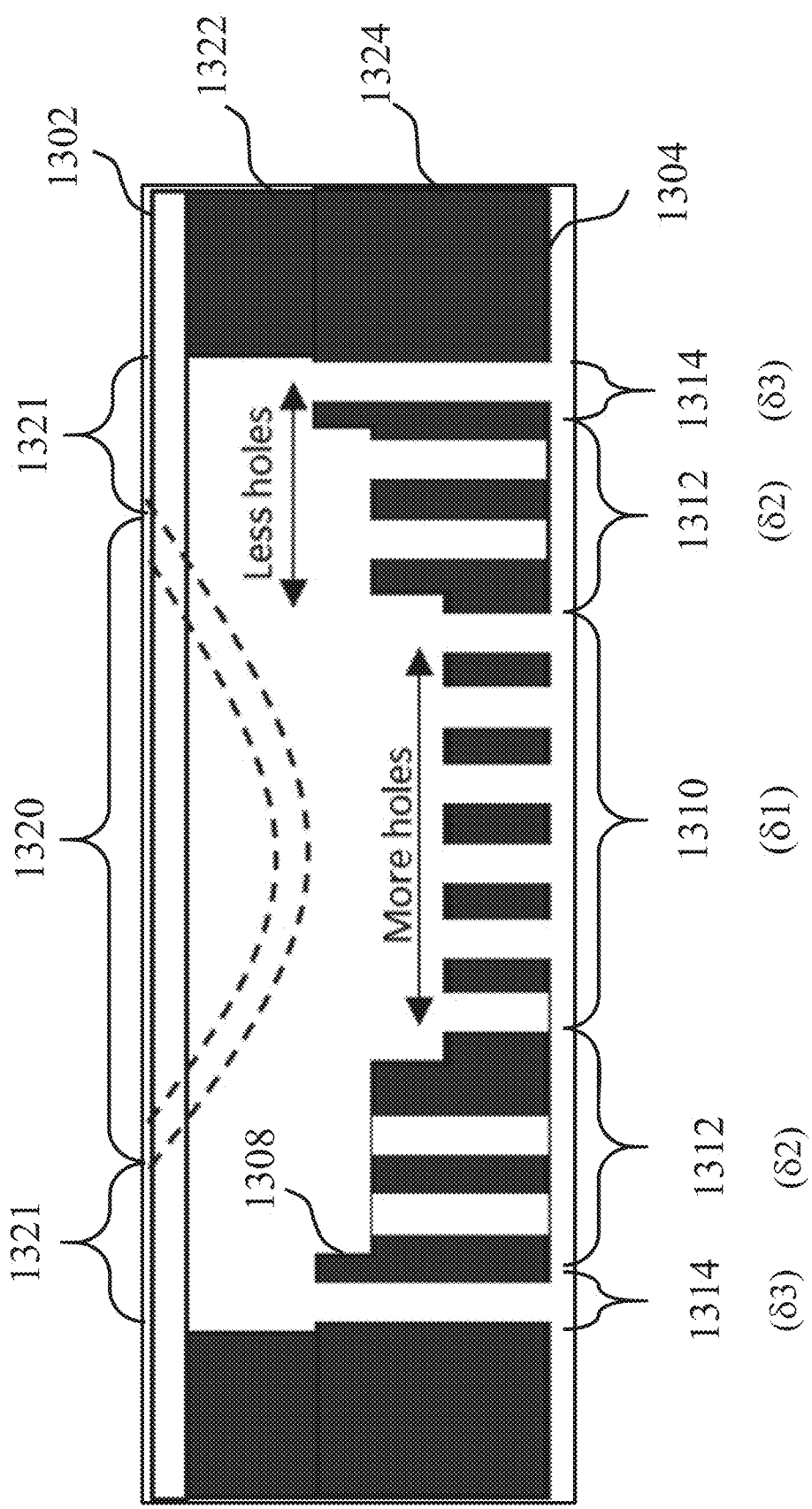
FIG. 13. A sectional view of a contour (e.g., stepped) cavity design.

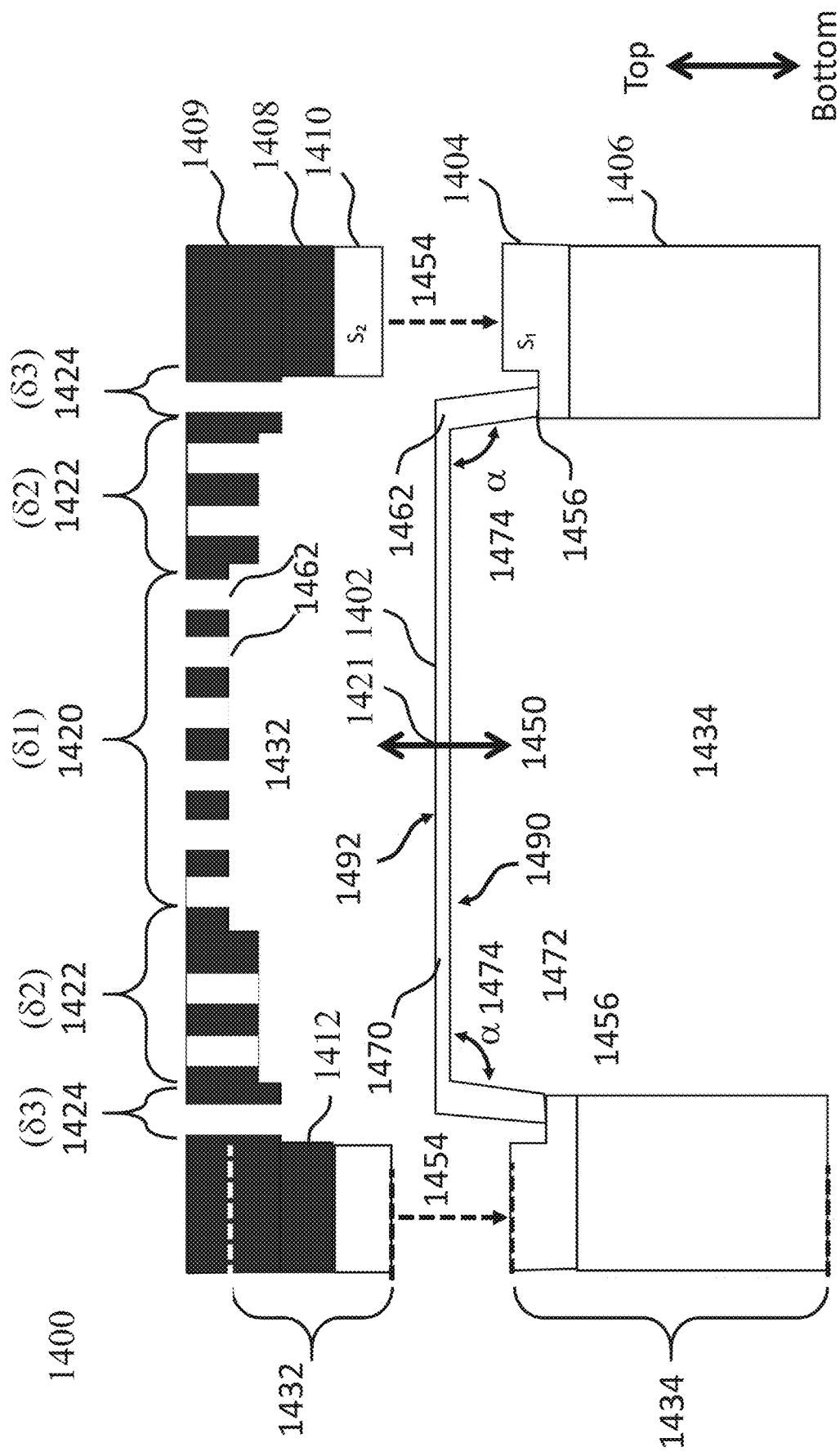
FIG. 14. A sectional view of a mesa diaphragm and a contour (e.g., stepped) cavity design.

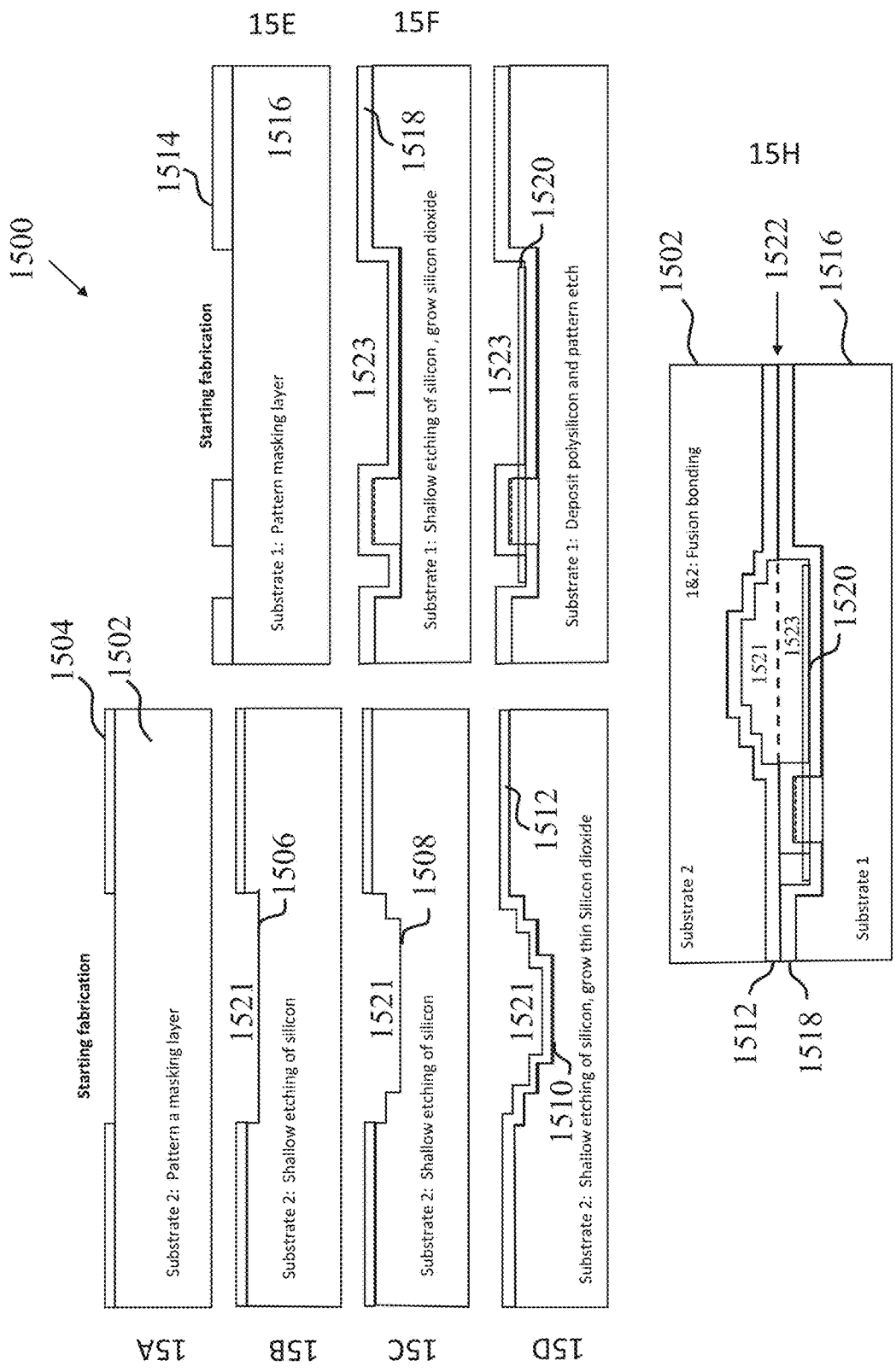
FIGs. 15A-15H Method to make a microphone

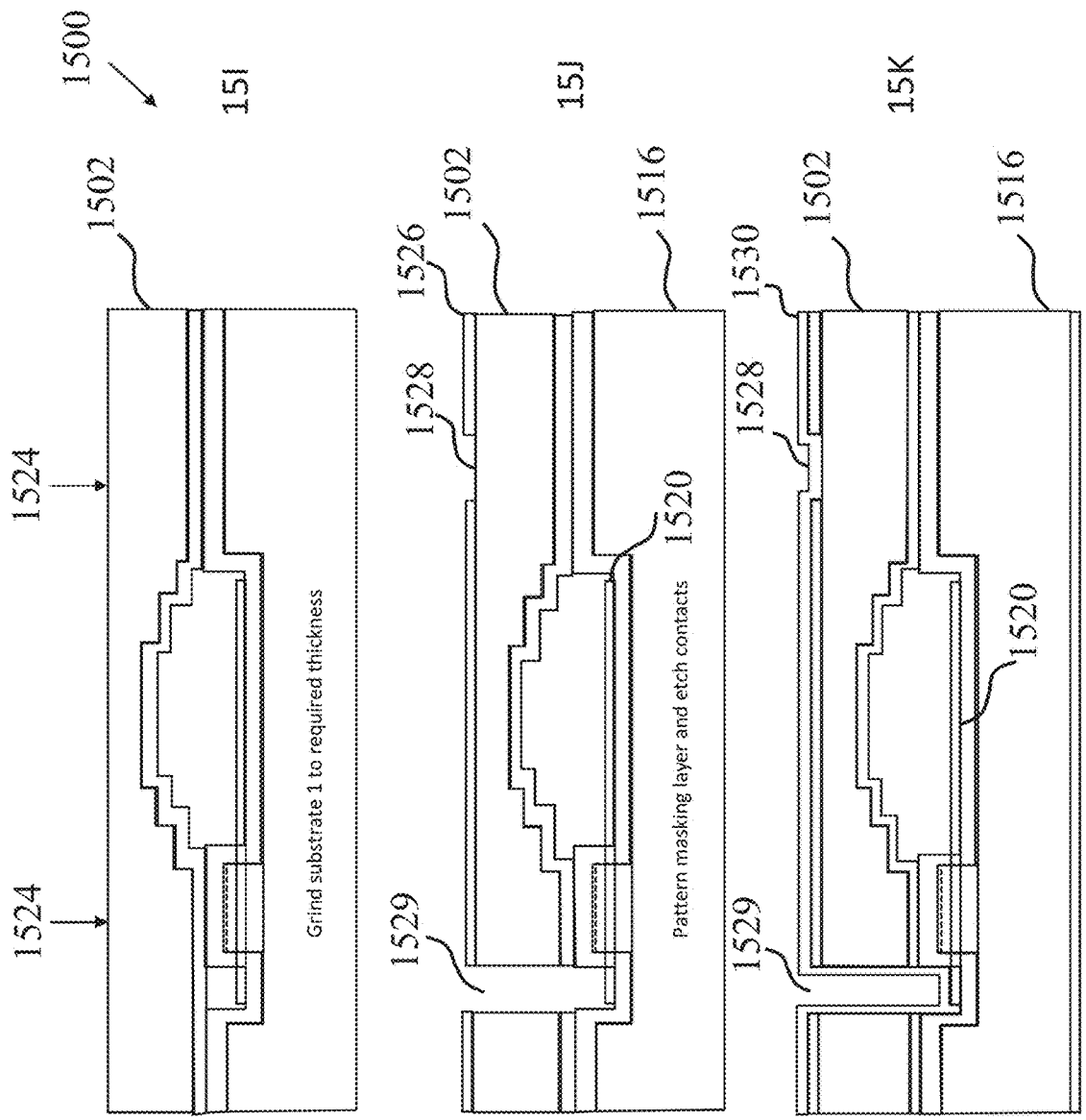
FIGs. 15I-15K Method to make a microphone

Method to make a microphone

CAPACITIVE MICROPHONE SENSOR DESIGN AND FABRICATION METHOD FOR ACHIEVING HIGHER SIGNAL TO NOISE RATIO

CROSS-REFERENCE TO RELATED APPLICATION

This application is a division of application Ser. No. 16/797,452, filed Feb. 21, 2020, which is incorporated by reference in its entirety herein.

FIELD OF DISCLOSURE

The disclosure generally relates to designs for microphones. More specifically, the disclosure is related to capacitive microphones and in particular designs and manufacturing processes that employ semiconductor manufacturing operations to achieve high signal to noise ratio.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

As the demand for sophistication is growing in communication devices, the same demand thus requires all components which are associated with making of these devices to be increasing in its standards. One of these communication devices is the mobile phone. There are numerous components that are included a single mobile phone. Among these components, some are fundamental to the device and without them the communication devices are virtually useless. One of those components is the microphone. The microphone is an essential component in any communication device that requires vocal input. The performance of microphone along with few other components dictates the mobile phone sound quality. Therefore, the demand for higher performance microphones is a constant requirement by mobile phone manufacturer.

A microphone is an ultra-low-pressure sensor that senses incoming sound pressure that causes mechanical vibration of air molecules. The sound pressure is typically in the range of a few Pascals. There are a few transduction mechanisms that can be utilized to sense the sound pressure. Those mechanisms may include piezoresistive, piezoelectric, and capacitive sensing. Each of these mechanisms has its own advantages and disadvantages in terms of microphone functionality. Capacitive sensing and piezoelectric sensing are more suitable for low pressure, high sensitivity sensing because their signal input to signal output ratio is higher than that of piezoresistive sensing.

There are few key performance parameters in microphones. These are sensitivity, frequency flatness and range, total harmonic distortion (THD), overload pressure, and signal to noise ratio (SNR). Among these parameters, SNR is a key parameters as well as a dominant parameters in defining sound quality. The SNR determines the quality of the sound over the whole operating range. Designing a microphone to get higher SNR is very challenging. Thus, the incumbent microphone used in the mobile phone industry is limited with −65 dB SNR. Achieving higher SNR with traditional designs is limited. Enhancing SNR performance of a microphone while maintaining competitive cost requires new innovative ideas.

SUMMARY

Fabrication of piezoelectric mechanisms have a variety of shortcomings. Microphone sensitivity require, in general, a very thin diaphragm for sensing the micro vibration of air molecules caused by the sound pressure. Piezoelectric mechanisms typically employ a piezoelectric material placed directly on the diaphragm for sensing the micro vibration of air. The structural overlapping of a diaphragm and piezoelectric material causes stress in the diaphragm, resulting in a decrease in sensitivity.

In the case of capacitive sensing, the traditional design has various shortcomings in terms of performances. In general, high sensitivity is achieved with shorter distance between two conductive plates. But shorter distance between two conductive plates increases leaking current, which increases the white noise level and reduces the signal to noise (SNR) ratio. The embodiments disclosed herein address various shortcomings for capacitive sensing to achieve higher performance.

Aspect 1. A capacitive micro-electromechanical transducer, comprising: a first substrate comprised of two or more layers and having an exterior surface, an interior surface, and a first cavity with a first opening at the exterior surface of the first substrate and a second opening at least proximate the interior surface of the first substrate, at least one of the layers of the first substrate comprising a mesa diaphragm that is electrically conductive and that extends across the second opening of the first cavity, at least a portion of the mesa diaphragm moveable along an oscillation axis; and a second substrate comprised of at least one layer and having an exterior surface, an interior surface, and a second cavity with an opening at least proximate the interior surface of the first substrate and a cavity bottom surface, the interior surface of the second substrate secured to the interior surface of the first substrate with the mesa diaphragm in registration with the opening with at least a portion of the mesa diaphragm positioned to oscillate along the oscillation axis between the first and the second cavities, where at least a portion of the second substrate is electrically conductive and the cavity bottom surface is non-planar.

Aspect 2. The capacitive micro-electromechanical transducer of Aspect 1 wherein a depth of the second cavity as measured perpendicularly from the second opening to the cavity bottom surface increases as the cavity is laterally traversed from a perimeter thereof to a center thereof.

Aspect 3. The capacitive micro-electromechanical transducer of Aspects 1-2 wherein the cavity bottom surface comprises a plurality of stepped regions, a depth of the second cavity as measured perpendicularly from the second opening to the cavity bottom surface increases as the cavity is laterally traversed from a perimeter thereof to a center thereof.

Aspect 4. The capacitive micro-electromechanical transducer of Aspects 1-3 wherein, at least when static, the mesa diaphragm extends longitudinally inwards along the oscillation axis, toward the cavity bottom surface.

Aspect 5. The capacitive micro-electromechanical transducer of Aspects 1-4 wherein a maximum perpendicular distance between mesa diaphragm and the cavity bottom surface renders a value of capacitance of the capacitive micro-electromechanical transducer independent of a thickness of an electrical isolation.

Aspect 6. The capacitive micro-electromechanical transducer of Aspects 1-5 wherein the second substrate includes a plurality of holes that extend from the cavity bottom surface through the exterior surface of the second substrate.

Aspect 7. The microphone of Aspects 1-6 wherein the plurality of holes that extend from the cavity bottom surface through the exterior surface of the second substrate are non-uniform in at least one of size or distribution, where a relative density of the holes or a relative size of the holes increasing as the cavity bottom surface is laterally or radially traversed from a perimeter thereof to a center thereof.

Aspect 8. The microphone of Aspects 1-7 wherein the holes of the plurality of holes are uniform is size in a lateral dimension, and a density of the holes is higher at a center than at a perimeter of the cavity bottom surface.

Aspect 9. The capacitive micro-electromechanical transducer of Aspects 1-8 wherein at least one of the first or the second substrates includes a vent that extends laterally from the second cavity to an exterior of at least one of the first or the second substrates to vent a chamber formed by the cavity and the mesa diaphragm.

Aspect 10. The capacitive micro-electromechanical transducer of Aspects 1-9 wherein the first substrate includes an electrically conductive line electrically coupled to the mesa diaphragm.

Aspect 11. The capacitive micro-electromechanical transducer of Aspects 1-10 wherein the first substrate includes an electrically conductive line electrically coupled to the electrically conductive portion of the second substrate.

Aspect 12. The capacitive micro-electromechanical transducer of Aspects 1-11 wherein the first substrate includes a wafer and at least one oxide layer carried by the wafer at least proximate the inner surface of the first substrate.

Aspect 13. The microphone of Aspects 1-12 wherein the first substrate includes a wafer and a first oxide layer carried by the wafer, and the second substrate includes an electrically conductive or semiconductive layer and a second oxide layer carried by the electrically conductive or semiconductive layer.

Aspect 14. The capacitive micro-electromechanical transducer of Aspects 1-13 further comprising: a fusion bond that secures the second substrate to the first substrate via the first and the second oxide layers.

Aspect 15. A microphone, comprising: a capacitive micro-electromechanical transducer; and a packaging that houses the capacitive micro-electromechanical transducer, the housing having at least two contacts on an exterior thereof, wherein the capacitive micro-electromechanical transducer comprises: a first substrate comprised of two or more layers and having an exterior surface, an interior surface, and a first cavity with a first opening at the exterior surface of the first substrate, at least one of the layers of the first substrate comprising a mesa diaphragm that is electrically conductive and that spans the first cavity, at least a portion of the mesa diaphragm moveable along an oscillation axis with respect to at least one layer of the first substrate; and a second substrate comprised of at least one layer and having an exterior surface, an interior surface, and a second cavity with a second opening at least proximate the interior surface of the second substrate and a cavity bottom surface, the interior surface of the second substrate secured to the interior surface of the first substrate with the mesa diaphragm in registration with the second opening with at least a portion of the mesa diaphragm positioned to oscillate along the oscillation axis at least partially into the second cavity, where at least a portion of the second substrate is electrically conductive and the cavity bottom surface is non-planar.

Aspect 16. The microphone of Aspect 15, further comprising: a capacitance sensor circuit electrically coupled to the mesa diaphragm and electrically coupled to at least the portion of the second substrate that is electrically conductive to sense a change in capacitance as the mesa diaphragm vibrates.

Aspect 17. A method to fabricate a capacitive micro-electromechanical transducer, the method comprising: forming a mesa diaphragm in a layer of a first substrate, the mesa diaphragm spanning a first cavity in at least a second layer of the first substrate, the first cavity open at an exterior surface of the first substrate, the exterior surface opposed to an interior surface of the first substrate; providing a second substrate having an interior surface, an exterior surface, and a second cavity formed in the interior surface of the second substrate, the second cavity having a second opening and terminating in a cavity bottom surface, the cavity bottom surface being non-planar across at least one lateral or radial dimension thereof; attaching the interior surface of second substrate to the interior surface of the first substrate with the mesa diaphragm in registration with the second cavity and with the mesa diaphragm oscillatable along a longitudinal axis at least partially into the second cavity.

Aspect 18. The method of Aspect 17, further comprising: patterning the cavity bottom surface.

Aspect 19. The method of Aspects 17-18 wherein patterning the cavity bottom surface includes forming a plurality of stepped regions, a depth of the second cavity as measured from the second opening to the cavity bottom surface increases as the cavity bottom surface is laterally or radially traversed from a perimeter thereof to a center thereof.

Aspect 20. The method of Aspects 17-19, further comprising:

forming a plurality of holes in the second substrate that extend from the cavity bottom surface through the exterior surface of the second substrate.

Aspect 21. The method of Aspects 17-20 wherein forming a plurality of holes in the second substrate includes forming the plurality of holes which are non-uniform in at least one of size or distribution, where a relative density of the holes or a relative size of the holes increasing as the cavity bottom surface is laterally or radially traversed from a perimeter thereof to a center thereof.

Aspect 22. The method of Aspects 17-21 wherein forming a plurality of holes in the second substrate includes forming the plurality of holes which are uniform in size a lateral dimension, and a density of the holes is higher at a center than at a perimeter of the cavity bottom surface.

Aspect 23. The method of Aspects 17-22, further comprising: forming at least one vent in at least one of the first or the second substrates that extends laterally from the second cavity to an exterior of at least one of the first or the second substrates to vent a chamber formed by the second cavity and the mesa diaphragm when the first and the second substrates are attached together.

Aspect 24. The method of Aspects 17-23 wherein attaching the interior surface of second substrate to the interior surface of the first substrate includes fusion bonding the interior surface of second substrate to the interior surface of the first substrate.

In at least one embodiment, the diaphragm includes polysilicon material and non-polysilicon materials. In another embodiment, the fusion bonding surface of the diaphragm does not contain any polysilicon film. In another embodiment, the fusion bonding surface at either plate, does not contain polysilicon film. In at least one embodiment, the fusion bonding temperature must be above 1000° C. in Oxygen (O$_2$) environment. In another embodiment, a thin layer of SiO2 can be deposited at the section of polysilicon prior to fusion bonding and can bond at lower temperature and create mesa structure. In at least one embodiment, the diaphragm can be in mesa formation.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings. Where a reference frame is provided (e.g., top/bottom) on a drawing sheet for a given Figure, that reference frame applies only to that Figure, and not necessarily to other Figures.

Various embodiments of this disclosure that are proposed as examples will be described in detail with reference to the following figures, and wherein:

FIG. 1 is a schematic view of a capacitor and power source according to one embodiment of the disclosure.

FIG. 2 is a schematic view of a capacitor with an isolation layer and a power source according to one embodiment of the disclosure.

FIG. 3 is a schematic view of a capacitor and a power source illustrating a polarization a pair of plates of the capacitor according to one embodiment of the disclosure.

FIG. 4 is a schematic view of a capacitor with at least one dielectric material filling at least a portion of a gap between plates of the capacitor according to one embodiment of the disclosure.

FIG. 5 is a schematic view of a capacitor according to an embodiment of the disclosure.

FIG. 6 is a schematic view of a capacitive microphone sensor according to one embodiment of the disclosure.

FIG. 7 shows a capacitive microphone according to one embodiment of the disclosure.

FIG. 9A shows a sectional view of a mesa diaphragm according to one embodiment of the disclosure.

FIG. 9B shows a sectional view of a microphone structure that has a mesa diaphragm according to one embodiment of the disclosure.

FIG. 10 shows a sectional view of a microphone structure that has a mesa diaphragm according to one embodiment of the disclosure.

FIG. 11 shows a sectional view of a microphone with a box cavity design according to one embodiment of the disclosure.

FIG. 12 shows a sectional view of a capacitor with a contoured cavity design according to one embodiment of the disclosure.

FIG. 13 shows a sectional view of a capacitor with a contoured cavity design according to one embodiment of the disclosure.

FIG. 14 shows a sectional view of a capacitor with a contoured cavity design and a mesa diaphragm according to one embodiment of the disclosure.

FIGS. 15A-15O show a method of make a capacitor with a contoured cavity design and a mesa diaphragm according to one embodiment of the disclosure.

DETAILED DESCRIPTION OF EMBODIMENTS

Figure 8A:
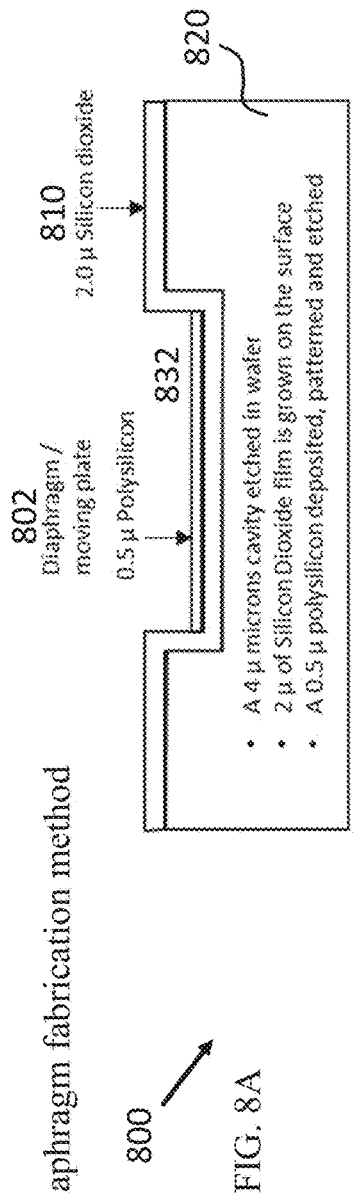
FIGS. 8A-8E illustrate a method to manufacturing a capacitive microphone with a mesa diaphragm using various fabrication operations according to one embodiment of the disclosure.

In the following description, some specific details are included to provide a thorough understanding of various disclosed embodiments. One skilled in the relevant art, however, will recognize that embodiments may be practiced without one or more of these specific details, or with other methods, components, materials, fabrication operations, etc. In other instances, well-known structures and fabrication operations associated with integrated circuit fabrication have not been shown or described in detail to avoid unnecessarily obscuring descriptions of the embodiments of the present methods. Throughout this specification and the appended claims, the words "element" and "elements" are used to encompass, but are not limited to, all such structures, systems, and devices associated with integrated circuit fabrication.

Unless the context requires otherwise, throughout the specification and claims which follow, the word "comprising" is synonymous with "including," and is inclusive or open-ended (i.e., does not exclude additional, unrecited elements or method acts), as are variations thereof, such as, "comprises" and "comprise."

Reference throughout this specification to "one embodiment" "an embodiment", "another embodiment", "one example", "an example", "another example", "one implementation", "another implementation", or the like means that a particular referent feature, structure, or characteristic described in connection with the embodiment, example, or implementation is included in at least one embodiment, example, or implementation. Thus, the appearances of the phrases "in one embodiment", "in an embodiment", "another embodiment" or the like in various places throughout this specification are not necessarily all referring to the same embodiment, example, or implementation. Furthermore, the particular features, structures, or characteristics may be combined in any suitable manner in one or more embodiments, examples, or implementations.

As used in this specification and the appended claims, the singular forms "a," "an," and "the" include plural referents unless the content clearly dictates otherwise. Thus, for example, reference to a layer includes a single layer, or two or more layers. It should also be noted that the term "or" is generally employed in its non-exclusive sense, i.e., "and/or" unless the content clearly dictates otherwise.

The headings provided herein are for convenience only and do not interpret the scope or meaning of the embodiments.

Working Principles of Capacitive Sensor

FIG. 1 shows a capacitor 100a according to one embodiment of the disclosure. FIG. 1 includes a first plate 102 and a second plate 104. The first plate 102 is coupled to a positive terminal of a power source 106. The second plate is coupled to a negative terminal of the power source 106. A cavity 108 exists between the first plate 102 and the second plate 104.

FIG. 2 shows a capacitor 100b according to one embodiment of the disclosure. Similar to FIG. 1, FIG. 2 includes a first plate 102 and a second plate 104. The first plate 102 is coupled to a positive terminal of a power source 106. The second plate is coupled to a negative terminal of a power source 106. A cavity 108 exists between the first plate 102 and the second plate 104, wherein the cavity 108 is created by disposing electrically isolation layer 110, e.g., silicon dioxide ($SiO_2$) between two plates 102, 104. Ideally, the two plates 102 and 104 should be electrically isolated and should have no current leakage (illustrated by arrow 112) between the two plates 102, 104. In reality, there is most likely a leakage current 112 between the two plates 102, 104. The smaller the current leakage 112, the better for the sensitivity of the capacitor. The larger the current leakage 112, the more the sensitivity of the capacitor is degraded.

FIG. 3 shows the capacitor 100b of FIG. 2 with a polarization of the plates 102, 104 illustrated. The first plate 102 may, for example have a relatively positive voltage while the second plate 104 may have a relatively negative voltage.

FIG. 4 shows a capacitor 110c where the cavity 108 is at least partially filled with dielectric material according to one embodiment of the disclosure. The dielectric material 114 may take the form of a fluid (i.e., gas, liquid) or a solid. Different dielectric materials may provide different permittivity ε, which can be expressed as a constant.

FIG. 5 shows a capacitor 100d according to an embodiment of the disclosure. The capacitor 100d includes a first plate 102 and a second plate 104. The first plate 102 is coupled to a positive terminal of a power source 106. The second plate is coupled to a negative terminal of a power source 106. A cavity 108 exists between the first plate 102 and the second plate 104, wherein the cavity 108 is defined by the first plate 102, second plate 104, and electrically isolation layer 110, e.g., silicon dioxide ($SiO_2$).

The first plate 102 and the second plate 104 have a surface area A 202. The electrically isolation layer 110 created a distance d 204 between the two plates 102, 104. The dielectric material 114 can, for example, take the form of air 206. Air 206 has a permittivity ε. The relationship between capacitance C, surface area A 202, distance d 204, and permittivity ε is $C=\varepsilon A/d$. Thus, to have a larger capacitance, the surface area A 202 should be larger, and/or the distance d 204 should be smaller, according to the equation of $C=\varepsilon A/d$.

Reducing the distance d 204 leads to a higher capacitance C. Thus, theoretically, a thinner isolation layer 110 leads to better performances. However, a thinner isolation layer 110 leads to larger current leakage 112 which compromises the performance. On the other hand, a thicker isolation layer 110 reduces the current leakage 112 between the plates 102, 104. See also FIG. 2. Therefore, one should find a distance d 204 and thickness of the isolation layer 110 that optimizes the overall capacitor performance.

Capacitor Mechanism Transferred to Capacitance Sensing

Various embodiments described herein advantageously employ capacitance sensing transducers or sensors to sense the micro vibration of air (e.g., changes in pressure or sound) and to produce an electrical signal that represents the sensed micro vibration of air.

FIG. 6 shows a capacitor 100e with a first plate 102 that is a flexible or moveable with respect to a second plate 104 of the capacitor. Notable, when the distance 204 between plates 102, 104 changes, the value of capacitance C changes. The distance 204 is inversional proportional to capacitance value, according to $C=\varepsilon A/d$. Therefore, for capacitive sensing, at least one of the plates 102, 104 in the capacitor 100e is movable with respect to the other (in FIG. 6, the movable plate is 102 which is also denominated as the diaphragm 102). Furthermore, a cavity 308 between two plates 102, 104 is at least partially filled with a gas, for example air. The cavity 308 is defined, at least partially, by the first plate 102, the second plate 104, and the insulation layer 110. Therefore, diaphragm 102 has the space to deflect or move when required. The diaphragm 110 responds to incident vibration of air by deforming in shape. This alteration of the distance d 204 between the plates 102, 104 changes the value of capacitance C (see FIG. 6). The change of capacitance C can be read out with various methods, e.g., the charging time of the capacitor, the voltage (V) change, or current (I) change. From the change in capacitance we can ascertain the amplitude of the air pressure or sound.

Capacitance Sensing Utilized for Sound Sensing

The sensing of sound (air micro vibration) employs dynamic pressure sensing unlike typical static pressure sensing. Therefore, specific design features are required from the basic capacitive structure, at least some of which design features are s shown in FIG. 7.

A microphone 700 includes a diaphragm 702. The diaphragm 702 may take the form of a first electrically conductive plate 102 that is flexible or moveable. The microphone 700 also includes a second electrically conductive plate 704. In some embodiments, the second electrically conductive plate 704 may be a fixed plate, while the diagram 702 is flexible or moveable with respect to the second electrically conductive plate 704. One or more isolation layers 706 are disposed between the diaphragm 702 and the second electrically conductive plate 704. A first cavity 708 is defined, at least partially, by the diaphragm 702, the second electrically conductive plate 704, and the isolation layer 706. The isolation layer 706 includes at least one vent 710. The vent 710 may extend in a direction parallel to a top and/or bottom surface of the diaphragm 702 and/or second electrically conductive plate 704. The vent 710 fluidically couples the first cavity 708 with an exterior of the microphone 700.

The second electrically conductive plate 704 includes a plurality of acoustic holes 712. The acoustic holes 712 provide a number of passages between the first cavity 708 and a second cavity 716.

A variable distance between the two plates 102, 104 is d 722. The isolation layer 706 has a thickness h 724. When the diaphragm 702 is static, the thickness h 724 of the isolation layer 706 is the same as the distance d 722. When the diaphragm 702 is vibrating, the perpendicular distance d 722 between a particular point of the diaphragm 702 and the conductive plate 704 may vary. Each point of the diaphragm 702 may have a different vibration amplitude. The vibration amplitude can be the largest at a central area of the diaphragm 702 and laterally reduced toward peripheral areas thereof. During vibration, a maximum perpendicular axial distance between a diaphragm 702 and the second electrically conductive plate 704 surface is within a defined range of between 1 nanometer and 50 micrometer.

Embodiments of this disclosure offer unique microphone designs and fabrication sequences that can achieve improved SNR, for example an SNR exceeding–65 dB. There are many ways to construct or fabricate semiconductor microphones. The capacitive sensor can be built in either a single substrate or using multiple substrates. However, each approach has its advantages. Furthermore, there are limitations in various designs and fabrications.

A microphone includes a transducer or sensor, packaging or housing, and optionally an amplifier circuit. Noise can originate from all three components in which acoustic noise from the sensor and floor noise from the amplifier are typically the largest and most significant sources of noise.

Embodiments of this disclosure are directed to the transducer, and in particular to reducing noise associated with the transducer which is sometimes referred to as acoustic noise. Ideally, acoustic noise should be reduced to zero if possible. The acoustic noise depends on a few parameters, including (a) leakage current between the plates; (b) gap size between the plates; and (c) acoustic hole density. These parameters are interdependent parameters and adjusting one parameter to improve performance may adversely affect another one of the parameters reducing performance.

As shown in FIG. 7, increasing the thickness h 724 of the isolation layer 706, will reduce acoustic noise because current leakage is reduced. However, increasing the thickness h 724 will reduce the capacitance C, where capacitance is given by the formula $C=\varepsilon A/d$, and when distance d is increased the capacitance C is reduced. As described below, some structures (e.g., contour cavity or step cavity) can be used to balance or at least partially offset the adverse effect on capacitance C that results from increasing the thickness h 724.

Increasing a total number and/or a total volume or total area of acoustic holes 712 can reduce acoustic noise. Such an increase will, however, reduce plate area A and thus adversely reduce capacitance C, where C is given by the formula $C=\varepsilon A/d$. Embodiments that include the distributed acoustic holes 712 (highest density toward the central area and laterally reduced densities toward peripheral areas) described herein can at least partially offset the adverse effect on capacitance C that results from increasing number, size and/or area of acoustic holes 712, which would otherwise reduce sensitivity. In at least some embodiments, acoustic holes 712 can be distributed with varying densities. For example, the density of the acoustic holes may advantageously be highest at or toward a center of the cavity and laterally reduced at or towards peripheral areas. Additionally or alternative, the acoustic holes can be distributed to advantageously vary the total open or ported area across a lateral dimension. For example, a total open or ported area may be relatively larger at or toward a center of the cavity and laterally reduced smaller at or towards peripheral areas.

As previously noted, increasing the isolation layer thickness h 724, reduces leakage current between plates, which in turn reduces acoustic noise. However, on the other hand, increasing the isolation layer thickness h 724 will increase the distance d 722 between both plates 702, 704 thereby reducing the capacitance C, thus adversely impacting the sensitivity. Various embodiments of this disclosure can overcome this counter effect. In various embodiments with a mesa diaphragm design as taught herein, the specific structural designs can advantageously make the capacitance C value independent of the thickness of the isolation layer h 724.

In at least one embodiment, the two electrically conductive plates 702, 704 are made from respective substrates. The substrates comprise different types of material from one another.

For example, a diaphragm 702 may be made, at least partially, from polysilicon substrate, while the second electrically conductive plate 704 may be made from non-polysilicon substrate.

In at least one embodiment, the second electrically conductive plate 704, which may be fixed, is formed as a stepped cavity structure. In at least one embodiment, the diaphragm 702 is formed inside the stepped cavity.

In at least one embodiment, the diaphragm 702 and the second electrically conductive plate 704 are bonded together, for example via the isolation layer by fusion bonding.

In at least one embodiment, the diaphragm 702 includes both polysilicon material and non-polysilicon material. In at least one embodiment, a fusion bonding surface of the diaphragm 702 does not contain any polysilicon film. In at least one embodiment, the fusion bonding surface at either diaphragm 702 and/or second electrically conductive plate 704 does not contain a polysilicon film. In at least one embodiment, the fusion bonding temperature must be above 1000° C. in an Oxygen ($O_2$) environment. In at least one embodiment, a thin layer of SiO2 can be deposited at the section of polysilicon prior to fusion bonding, and can thus advantageously bond at lower temperature and create mesa structure.

Mesa Diaphragm Design and Manufacture

FIGS. 8A-8E shows a method 800 of producing a microphone with a diaphragm mesa formation according to at least one embodiment of the disclosure.

As illustrated in FIG. 8A, the method 800 includes, at least, preparing a first semiconductor substrate 820. Method 800 may include etching at least a portion of a top surface of the first semiconductor substrate 820 to form a cavity 832. The cavity 832 can have a depth of, for example, 2 μm-10 μm recessed into the semiconductor substrate 820. In at least one embodiment, the cavity 832 is recessed 4 μm deep into the first semiconductor substrate 820.

Method 800 includes depositing a first silicon dioxide layer 810 on the top surface of the first semiconductor substrate 820. The first silicon dioxide 810 layer can have a thickness, for example, of 0.5 μm-6 μm. In at least one embodiment, the first silicon dioxide layer has a thickness of 2 μm. The first silicon dioxide layer 810 covers a top surface within the recessed cavity as shown in FIG. 8A.

The method 800 includes depositing a first polysilicon layer 802 on the top surface of the first semiconductor substrate 820 within the recessed cavity. This polysilicon layer 802 constitutes the diaphragm that vibrates due to sound waves. The polysilicon layer 802 is deposited on a top surface of the silicon dioxide 810 layer in the cavity 832 as shown in FIG. 8A.

Figure 8B:
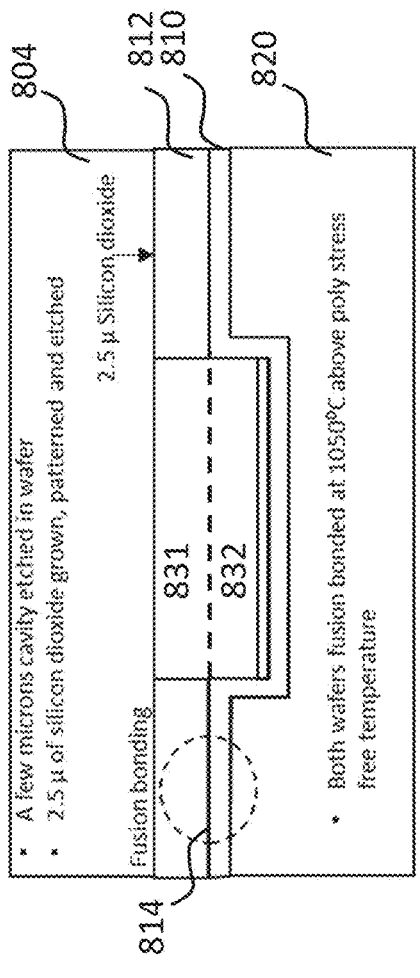
Figure 8C:
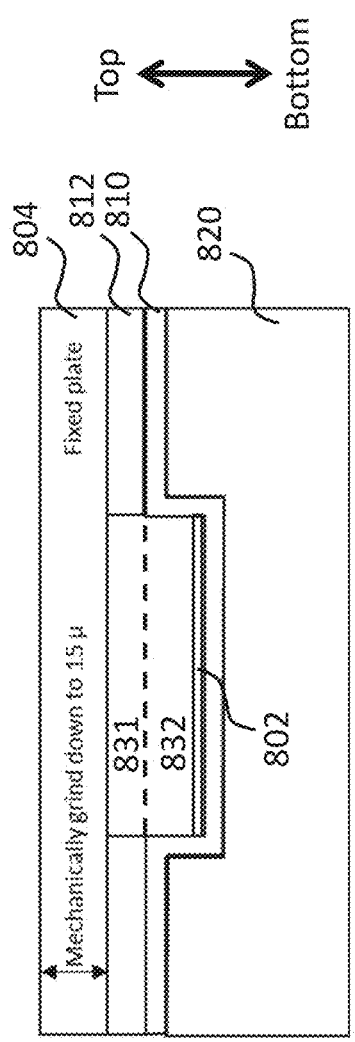

As illustrated in FIG. 8B, the method 800 includes preparing a second semiconductor substrate 804. In at least one embodiment, the method includes etching a second cavity 831 into the bottom surface of the second semiconductor substrate 804, such that when the second semiconductor substrate is bonded with the first semiconductor substrate, the second cavity 831 and the first cavity 832 are fluidically connected. The dash line in FIG. 8B and FIG. 8C shows the separation (e.g., an imaginary boundary) of the first cavity 832 and the second cavity 831. As shown in FIG. 8C, the first cavity 832 is recessed into the first semiconductor substrate 820. The second cavity 831 is recessed into the second semiconductor substrate 804.

As further illustrated in FIG. 8B, the method 800 includes depositing a second silicon dioxide layer 812 on a bottom surface of the second silicon semiconductor substrate 804. In at least one embodiment, the second silicon dioxide layer 812 is not deposited in the cavity 832. The second silicon dioxide layer 812 can have a thickness, for example, of 1 μm-5 μm. In at least one embodiment, the second silicon dioxide layer 812 has a thickness of 2.5 μm.

As further illustrated in FIG. 8B, the method 800 includes fusion bonding of the bottom surface of the second silicon dioxide layer 812 and a top surface of the first silicon dioxide layer 810, forming a bonding surface 814. Fusion bonding is also known as thermal bonding. Fusion bonding includes increasing the temperature to a point that the silicon dioxide molecules at or around the bottom surface of the second silicon dioxide layer 812 and a top surface of the first silicon dioxide layer 810 (e.g., bonding surface) fuse into each other and forms covalent bonds between the first 810 and the second 812 silicon dioxide layers. In at least one embodiment, the temperature for fusion bonding is, for example, about 950° C. to 1150° C. In at least one embodiment, the temperature for fusion bonding is, for example, 1050° C.

As illustrated in FIG. 8C, the method 800 includes grinding or polishing (e.g., chemical-mechanical planarization) the second semiconductor substrate 804 to a thickness, for example, of 10 μm-30 μm. In at least one embodiment, the second semiconductor substrate 804 has a thickness of 15 μm after grinding or polishing.

Figure 8D:
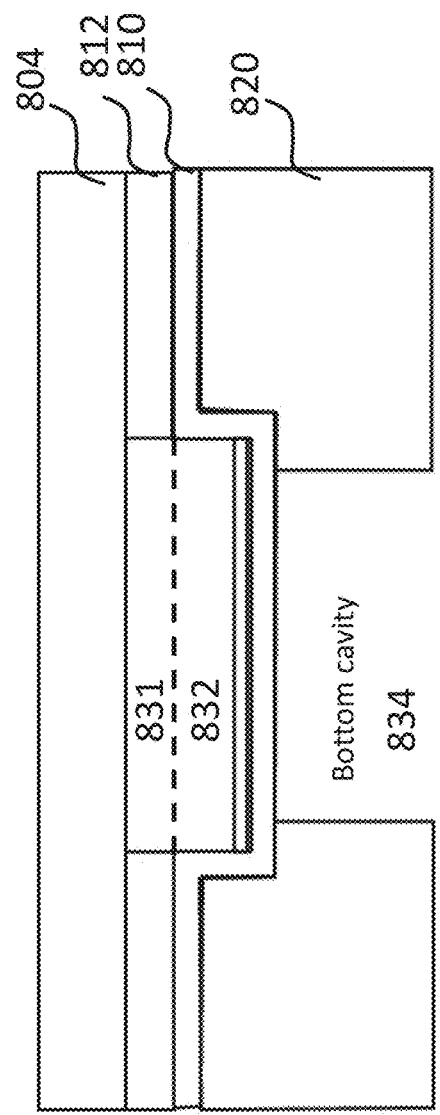

As shown in FIG. 8D, the method 800 includes etching bottom cavity 834 from a bottom surface of the first semiconductor substrate 820. This bottom cavity 834 will merge into and end up being part of the first cavity 832. At FIG. 8D, the bottom cavity 834 is defined, at least partially, by the first semiconductor substrate 820 and the first silicon dioxide layer 810. The bottom cavity 834 is fluidically coupled to an exterior of the microphone. In at least one embodiment, the bottom cavity 834 includes an opening to the exterior of the microwave to receive the sound pressure waves. The dash line in FIG. 8D shows the separation (e.g., an imaginary boundary) of the first cavity 832 and the second cavity 831.

Figure 8E:
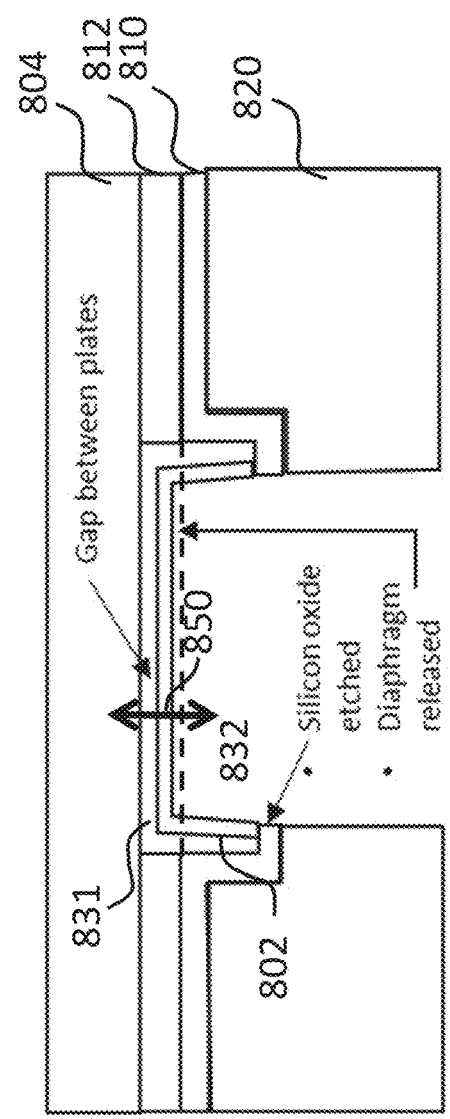

As illustrated in FIG. 8E, the method 800 includes etching away the first silicon dioxide layer 810 from a bottom side of the first silicon dioxide layer 810. The first silicon dioxide layer 810 in the bottom cavity 834 is being etched away. In FIG. 8E, the bottom cavity 834 is merged into and becomes part of the first cavity 832. The first cavity 832 is now fluidically coupled to an exterior to the capacitive acoustic transducer package or microphone. In at least one embodiment, the first cavity 832 includes an opening to the exterior of the microphone to receive the sound pressure waves. The dash line in FIG. 8E shows the separation (e.g., an imaginary boundary) of the first cavity 832 and the second cavity 831.

After the first silicon dioxide layer 810 is etched away, the polysilicon layer that comprises the diaphragm 802 is released. In response to releasing the diaphragm 802, the diaphragm 802 flips up and forms a mesa shape, i.e., a mesa diaphragm. The diaphragm 802 extends towards and into the second cavity 831, as shown in FIG. 8E. The diaphragm 802 extends inwardly into the second cavity 831.

The diaphragm 802 vibrates 850 in response to receipt of sound pressure waves. This means the value of capacitance C changes or varies dynamically (i.e., over time). The changes of the value of capacitance C can be detected electronically. The changes of the value of capacitance C represents one or more characteristics (e.g., amplitude, frequency) of the sound pressure waves received. The mesa diaphragm 802 is structured such that the diaphragm 802 does not touch a bottom surface of the second semiconductor substrate 804 or when the diaphragm 802 vibrates.

FIG. 9A is a sectional view of a mesa diaphragm 902 according to one embodiment of the disclosure. A cross-sectional shape of the mesa diaphragm 902 is similar in shape to a trapezoid without a base. The mesa diaphragm 902 has a flat top boarder 970, and two sloping side boarders 972 in a sectional view.

The mesa diaphragm 902 includes an inner surface 990. In at least one embodiment, the inner surface 990 faces the first cavity 934 (FIG. 9B). The mesa diaphragm 902 includes an outer surface 992. In at least one embodiment, the outer surface 992 faces the second cavity 932 (FIG. 9B).

As best illustrated in FIG. 9A, the mesa diaphragm 902 when un-deformed has a profile (cross-section) that is similar to a trapezoid without a base. The mesa diaphragm 902 includes a top boarder 970 and two side boarders 972. The bottom ends of the side boarders 972 have anchors 956. In at least one embodiment, the anchors 956 attach to the first silicon dioxide layer 910 (FIG. 9B). The side boarder 972 joins the top boarder 970 at a corner 962. The corner 962 has an angle α 974 measured from the inner surface 990. In at least one embodiment, the angle α 974 is larger than 70°, 80°, 90°, 100°, or 110°.

FIG. 9B shows a design of a microphone with mesa diaphragm according to at least one embodiment of the disclosure.

As shown in FIG. 9B, the microphone 901 includes a mesa diaphragm 902. The mesa diaphragm vibrates 950 when sound pressure waves 960 reach the mesa diaphragm 902. The mesa diaphragm 902 has one or more anchors 956 attached to the first silicon dioxide layer 910. The center portion of the mesa diaphragm 902 can freely vibrate with as the sound pressure wave 960 varies in frequency and amplitude. The center portion of the mesa diaphragm 902 vibrates in a direction that is perpendicular to a top or bottom surface of the mesa diaphragm 902. The diaphragm 902 is structured and positioned such that the diaphragm 902 does not contact the second semiconductor substrate 904 during vibration 950, maintaining the characters of a capacitor.

In at least one embodiment, because the mesa diaphragm 902 is very flexible and anchored to the first silicon dioxide layer 910, when mesa diaphragm 902 is vibrating 950, at least a portion of the top boarder 970 of the mesa diaphragm 902 may form arcuate surfaces (e.g., concave and/or convex), similar to diaphragm 102 in FIG. 6.

In at least some embodiments, the corners 962 are formed or exist when the diaphragm is static. In at least one embodiment, during the manufacturing process, e.g., method 800, the corners 962 are formed when the first isolation layer 910 (see also e.g., 810) is etched away from a bottom surface of the diaphragm 902. When the first isolation layer 910 (see also e.g., 810) is etched away from a bottom surface of the diaphragm 902, the diaphragm 902 flips upward and extends toward the second substrate 904 forming the mesa structure as shown in FIGS. 9A and 9B. Thus, in such embodiments, the corners 962 exist when the mesa diaphragm 902 is static (not deformed).

The first silicon dioxide layer 910 and the second silicon dioxide layer 912 are bonded 954 together (the arrow of 954 shows the bonding orientation). The top surface of the first silicon dioxide layer 910 is a bonding surface. The bottom surface of the second silicon dioxide layer 912 is another bonding surface. The two bonding surfaces are covalently bonded through fusion bonding process, e.g., baking the device for example at a temperature of about 950° C. to 1200° C. for a period of time. In at least one embodiment, the baking temperature is 1050° C. Under such temperature(s), the silicon dioxide molecules in both silicon dioxide layers fuses across the bonding surface. Therefore, the top surface of the first silicon dioxide layer 910 and the bottom surface of the second dioxide layer 912 are covalently bonded.

The second silicon dioxide layer 912 includes a vent hole 964 that extends through the second silicon dioxide layer 912. The vent hole 964 fluidically couples the second cavity 932 and an exterior of the microphone 901. The vent hole 964 runs, for example, in a direction parallel to a top and/or bottom surface of the first 920 and/or second 904 semiconductor substrate.

The second semiconductor substrate 904 includes one or more vent holes 963 The vent hole 963 fluidically couples the second cavity 932 and an exterior of the microphone 901. The vent holes 963 run, for example, in a direction perpendicular to a top and/or bottom surface of the first 920 and/or second 904 semiconductor substrate.

The first cavity 934 is recessed into the first semiconductor substrate 904. The first cavity 934 is fluidically coupled to an exterior of the microphone.

FIG. 10 shows a sectional view of a microphone according to at least one embodiment of the disclosure.

As shown in FIG. 10, there is a distance G between a top surface of the mesa diaphragm 902 and a bottom surface of the second semiconductor substrate 904; a distance $d_1$ between a bottom end (anchors) of the mesa diaphragm 902 and a bottom surface of the second semiconductor substrate 904 in the second cavity 932; a distance $d_2$ between a bottom end (anchors) of the mesa diaphragm 902 and the bottom surface of the top boarder of the mesa diaphragm 902; and a thickness t of the mesa diaphragm 902. The distance G and the distance $d_2$ varies as the mesa diaphragm 902 vibrates over time and varies across one or more dimensions (e.g., radial dimensions) of the mesa diaphragm 902 at any given time during vibration. The relationship between G, $d_1$, $d_2$, and t can be expressed as: $G=d_1-(d_2+t)$.

$S_1$ is the thickness of the first silicon dioxide layer 910; do is the distance between a bottom end of the first silicon dioxide layer 910 and a bottom surface of the second semiconductor substrate 904 in the second cavity 932. The relationship between $d_1$, $d_0$, and $S_1$ can be expressed as: $d_1=d_0-S_1$.

$C_1$ is the depth of a recession. The recession is a portion of the first cavity 934 made by an etching operation from a top surface of the first semiconductor substrate 920. See 832 at FIG. 8A for example. $C_1$ is the distance between a bottom surface of the recession and a top surface of the first semiconductor substrate 920. $S_2$ is the thickness of the second silicon dioxide layer 912. The relationship between $d_0$, $C_1$, $S_1$, and $S_2$ can be expressed as: $d_0=C_1+S_1+S_2$.

Since $d_1=d_0-S_1$ and $d_0=C_1+S_1+S_2$, thus $d_1=(C_1+S_1+S_2)-S_1$. Therefore, $d_1=C_1+S_2$.

Since $G=d_1-(d_2+t)$ and $d_1=C_1+S_2$, thus G can be expressed as $$G=(C_1+S_2)-(d_2+t) \qquad \text{Eq. 1}$$

The Eq. 1 shows the thickness of the first isolation layer ($S_1$) 910 is independent of the value of G, where G is the distance between a top surface of the mesa diaphragm 902 and a bottom surface of the second semiconductor substrate 904. This means the first isolation layer ($S_1$) 910 can be any thickness without having an effect of G. This also means with the mesa diaphragm design shown in FIG. 10A, the $S_1$ can be increased for the purpose to reduce leaking current without compromising on the sensitivity of the microphone.

In addition, the thickness $S_2$ of the first silicon dioxide layer 910 can be maximized by adjusting the values of $C_1$ and $d_2$. According to Eq. 1: $G=(C_1+S_2)-(d_2+t)$, the effect on G due to an increase of $S_2$ for a certain amount can be cancelled by a reduction of $C_1$ for the same amount, or in alternative an increase of $d_2$ for the same amount. Increasing $S_2$ can reduce the leaking current noise which in turn increasing the sensitivity of the microphone. Thus, the mesa diaphragm design shown in FIGS. 8A, 8B, 9A, 9B, and 10 provides the structural design that allows the microphone device to have very low leaking current noise, with no or insignificant impact on the microphone's sensitivity.

Contour Cavity Design

As previously shown, the capacitance plates (movable and fixed plates) are made in two separate conductive and/or semiconductive substrates. The movable plate (diaphragm) is formed in one of the substrates. The fix plate is formed in a separate substrate. These two separates plates are combined with a dielectric (e.g., air) there between to constitute a capacitor. The two separate substrates are attached to each other, for example through fusion bonding.

Combining a contour cavity design with mesa diaphragm improves microphone performance with reduced acoustic noise. When sound pressure waves impinge on diaphragm 1104, the diaphragm 1104 bends or deforms in the form shown in FIG. 11.

As shown in FIG. 11, the peripheral area 1102 of the diaphragm 1104 hardly moves. About ⅓ of total area of diaphragm 1104 that is proximate the peripheral area 1102 has very little or no movement. Most, if not all, of the vibrations of the diaphragm 1104 occur in the central area 1103. The peripheral area 1102 does not significantly contribute to overall sound pressure sensing except for the basic capacitor construction. Therefore, embodiments disclosed herein modify the flat parallel plate concept to a contour parallel plate concept in which a portion (e.g., bottom surface of cavity) of the fix plate 1106 is modified to be complementary to the deflection of diaphragm 1104 to maximize the capacitance changes when the diaphragm 1104 vibrates.

FIG. 12 shows a sectional view of a contour cavity design according to at least one embodiment of the disclosure. In FIG. 12, the contour of the fix plate 1206 is implemented as a stepped contour surface 1208. A stepped contour surface 1208 can be manufactured in a semiconductor processing. It is noted that FIG. 12 does not present a limitation to any of the embodiments in this disclosure to include a smooth concave surface at a top surface of the fixed plate facing the diaphragm. For example, the step size can be reduced within the limits of the particular fabrication process being used, and the total number of steps increased to at least approach a relatively smooth contour or curvature where distinct steps in the surface become undetectable via unaided human vision.

The stepped contour surface 1208 has at least two levels of steps, wherein the bottom level 1210 (the lowest level) of the stepped contour surface 1208 is centered around or facing a central area 1220 of the diaphragm 1204 that has the largest vibration magnitude or amplitude. Here, the largest vibration magnitude or amplitude of the central area 1220 is in comparison to the peripheral area 1221 of the diaphragm 1204. The area 1220 includes a particular point of the diaphragm 1204, e.g., the center point, that provides the largest vibration magnitude or amplitude when the diaphragm 1204 receives the sound wave pressure. In one at least one embodiment, the area 1220 of the diaphragm 1204 that has the largest vibration magnitude or amplitude is at or around a central area of the diaphragm 1204.

As shown in FIG. 12, the stepped contour surface 1208 cavity includes three steps 1210, 1212, 1214. The lowest level step is 1210 is facing a central area of the diaphragm 1220. The highest level step 1214 is facing the peripheral area 1221 of the diaphragm 1214. In some embodiments, the highest level step 1214 is faces against the anchors of the diaphragm 1204. The middle level step 1212 is disposed between the lowest level step 1210 and the higher level step 1214.

FIG. 13 shows a sectional view of a contour cavity design with vent holes according to one embodiment of the disclosure. In FIG. 13, the contour of the fix plate 1304 is a stepped contour surface 1308.

The stepped contour surface 1308 has three levels of steps 1310, 1312, 1314, wherein the bottom level 1310 (the lowest level) of the stepped contour surface 1308 is centered around or facing an area 1320 of the diaphragm 1302 that has the largest vibration magnitude or amplitude. Here, the largest vibration magnitude or amplitude of the area 1320 is in comparison to the peripheral area 1321 of the diaphragm 1302. The central area 1320 includes a point of the diaphragm 1302 that provides the largest vibration magnitude or amplitude when the diaphragm 1302 receives the sound pressure.

As shown in FIG. 13, the stepped contour surface 1308 of the cavity includes three steps 1310, 1312, 1314. The lowest level step is 1310 is facing at or around a central area 1320 of the diaphragm 1302. The highest level step 1314 is facing a peripheral area 1321 of the diaphragm 1302. In some embodiments, the highest level step 1314 is proximate to the anchors (the point of attachment) of the diaphragm 1302. The middle level step 1312 is disposed between the lowest level step 1310 and the higher level step 1314.

The lowest level step 1310 includes one or more vent holes with a first density ($\delta 1$). The middle level step 1312 includes one or more vent holes with a second density ($\delta 2$). The highest level step 1314 includes one or more vent holes with a third density ($\delta 3$). The first density is greater than the second density, and the second density is greater than the third density, expressed as $\delta 1 > \delta 2 > \delta 3$. Because the lowest level step 1310 is facing at or around a central area 1320 of the diaphragm 1302 where the vibration magnitude or amplitude is the largest, the highest density ($\delta 1$) of vent holes reduces the ambient noise. However, too many vent holes may reduce the surface area of the fixed plate 1304, and subsequently reduce the capacitance value according to $C = \varepsilon A/d$. Thus, the higher level step 1314 with the lowest density $\delta 3$ of vent hole faces the peripheral areas 1321 of the diaphragm 1302 where the vibration magnitude or amplitude is minimum and does not significantly affect the reduction of ambient noise yet maintains the surface area of the fix plate 1304. The density distribution $\delta 1 > \delta 2 > \delta 3$ as show in FIG. 13 maximizes the reduction of ambient noise and minimizes the reduction of capacitance value according to $C = \varepsilon A/d$ at the same time.

FIG. 14 shows a sectional view of a mesa diaphragm 1402 and a contour (e.g., stepped) cavity design. The mesa diaphragm 1402 is attached to the first isolation layer 1404 at the anchors 1456. The first isolation layer 1404 is attached to the first substrate 1406.

The outer surface 1492 of the mesa diaphragm 1402 faces the stepped contour surface 1412 of the second substrate (e.g., fix plate) 1408. The second isolation layer 1410 is attached to the second substrate 1410.

The first isolation layer 1404 and the second isolation layer 1410 are bonded together 1454 (the arrow shows the bonding orientation). In at least one embodiment, the bonding involves forming covalent bonds between the two isolation layers 1404 and 1410.

The mesa diaphragm 1402 has a profile or cross-sectional shape similar to the shape of a trapezoid without a base. The mesa diaphragm 1402 includes an inner surface 1490. In at least one embodiment, the inner surface 1490 faces the first cavity 1434. The mesa diaphragm 1402 includes an outer surface 1492. The outer surface 1492 faces the stepped contour surface 1412. In at least one embodiment, a top boarder of the mesa diaphragm 1402 is entirely located within the second cavity 1432. A portion of the second cavity 1432 is connected to the first cavity 1434. From a bottom side, the second cavity 1432 starts from a bottom surface of the second substrate 1408 and extends up to a recessed surface of the second substrate 1408. The first cavity 1432 is recessed in both the first substrate 1406 and 1408.

In a sectional view such as FIG. 14, the mesa diaphragm 1402 has a shape similar to the shape of a trapezoid without a base. The mesa diaphragm 1402 includes a top boarder 1470 and two side boarders 1472. The bottom ends of the side boarders 1472 have anchors 1456. In at least one embodiment, the anchors 1456 are attached to the first silicon dioxide layer 1404. The side boarder 1472 joins the top boarder 1470 at a corner 1462. The corner 1462 has an angle $\alpha$ 1474 at the inner surface 1490. In at least one embodiment, the angle $\alpha$ 1474 is larger than 70°, 80°, 90°, 100°, or 110°. The top boarder 1470 have a top surface that is at the outer surface 1492 and a bottom surface that is at the inner surface 1490. The side boarder 1472 has an inner surface that is at the inner surface 1490 and an exterior surface that is at the outer surface 1492.

As shown in FIG. 14, the microphone 1400 includes a mesa diaphragm 1402. The mesa diaphragm vibrates 1450 in a perpendicular direction when sound pressure reaches the mesa diaphragm 1402. The mesa diaphragm has one or more anchors 1456 attached to the first silicon dioxide layer 1404. The center portion 1421 of the mesa diaphragm 1402 can freely vibrate with the sound pressure. The center portion 1421 of the mesa diaphragm 1402 vibrates in a direction that is perpendicular to a top boarder of the mesa diaphragm 1402. The diaphragm 1402 is structured such that it does not touch a surface of the second substrate 1408 during vibration 1450. During vibration 1450, the center portion 1421 provides the largest vibration magnitude compared to the rest of the portion of the mesa diaphragm 1402.

The first silicon dioxide layer 1404 and the second silicon dioxide layer 1410 are bonded 1454 together (the arrow of 1454 shows the bonding orientation). The top surface of the first silicon dioxide layer 1404 is a bonding surface. The bottom surface of the second silicon dioxide layer 1410 is another bonding surface. The two bonding surfaces are covalently bonded through fusion bonding process, e.g., baking the device at or about 950° C. to 1150° C. for a period of time. In another embodiment, the baking temperature is 1050° C. Under such temperature, the molecules in both silicon dioxide layers fuses across the bonding surface and merges into a single structure. Therefore, the top surface of the first silicon dioxide layer 1404 and the bottom surface of the second dioxide layer 1410 are covalently bonded.

In at least one embodiment, the second silicon dioxide layer 1410 may have a vent hole (not shown in FIG. 14. See vent hole 964 in FIG. 9B for example) going through the second silicon dioxide layer 1410. The vent hole would fluidically connect the second cavity 1432 and an exterior of the microphone 1400. The vent hole may run in a direction parallel to a top and/or bottom surface of the first 1406 and/or second 1408 semiconductor substrate.

The second semiconductor substrate 1408 includes one or more vent holes 1462. The vent holes 1462 fluidically connect the first cavity 1432 and an exterior of the microphone 1400. The vent hole 1462 runs in a direction perpendicular to a top and/or bottom surface of the first 1406 and/or second 1408 semiconductor substrate. The first semiconductor substrate 1406 includes the first cavity 1434. The second semiconductor substrate includes the second cavity 1408.

In FIG. 14, the contour 1409 of the second semiconductor substrate 1408 is a stepped contour surface 1412. A stepped contour surface 1412 may be manufactured in a semiconductor processing. It is noted FIG. 14 does not present a limitation to any of the embodiments in this disclosure to include a smooth concave surface at a surface of the second semiconductor substrate 1408 facing the diaphragm.

The stepped contour surface 1412 has three levels of steps 1420, 1422, 1424, wherein the bottom level 1420 (the lowest level) of the stepped contour surface 1412 is centered around or facing a central area 1421 of the diaphragm 1402 that has the largest vibration magnitude. Here, the largest vibration magnitude of the area 1421 is in comparison to the rest of the area of the diaphragm 1402. The central area 1421 includes a point of the diaphragm 1402 that provides the largest vibration magnitude when the diaphragm 1402 receives the sound pressure. In at least one embodiment, the area 1421 of the diaphragm 1402 that has the largest vibration magnitude is at or around a central area of the diaphragm 1402.

As shown in FIG. 14, the stepped contour surface 1412 cavity includes three steps 1420, 1422, 1424. The lowest level step is 1420 is facing at or around a central area 1421 of the diaphragm 1402. The highest level step 1424 is facing a peripheral area of the diaphragm 1402. In some embodiments, the highest level step 1424 faces the anchors 1456 of the diaphragm 1402. The middle level step 1422 is disposed between the lowest level step 1420 and the higher level step 1424.

The lowest level step 1420 includes one or more vent holes 1462 with a first density ($\delta 1$). The middle level step 1422 includes one or more vent holes 1462 with a second density ($\delta 2$). The highest level step 1424 includes one or more vent holes 1462 with a third density ($\delta 3$). The first density is greater than the second, and the second is greater than the third, expressed as $\delta 1 > \delta 2 > \delta 3$.

Figures 15L, 15M, 15N, 15O:
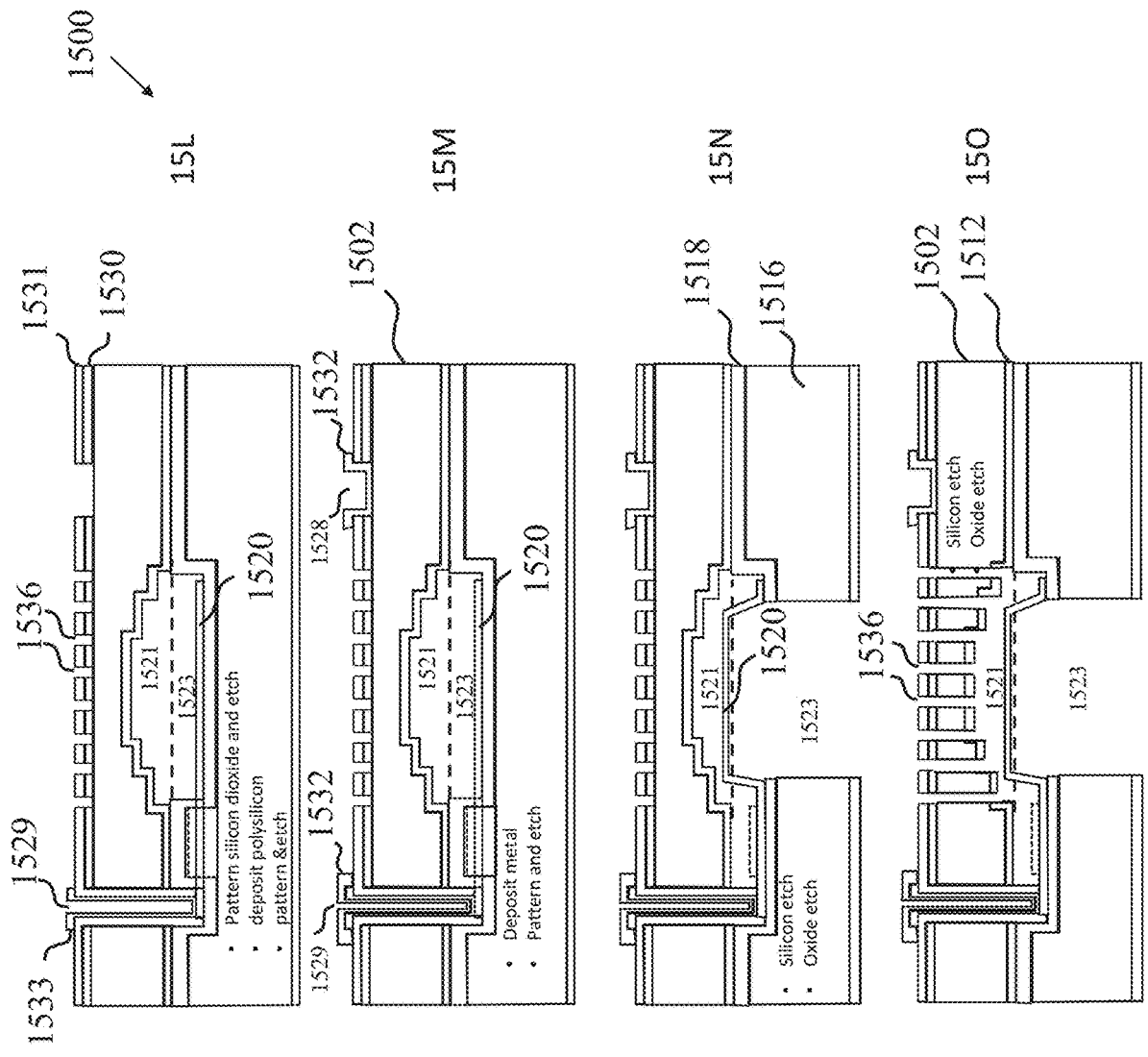

FIGS. 15A-15O show a fabrication method 1500 to make a capacitive acoustic transducer with mesa diaphragm and contoured fix plate suitable for a microphone. The fabrication method 1500 can be implemented with any variety of conventional fabrication machines or processes (e.g., depositing, etching, masking, planarizing), many or all of which may be automated via a fabrication system. In at least one embodiment, the method 1500 can be used to make a microphone 1400.

As illustrated in FIG. 15A, the second substrate 1502 is provided or prepared. The second substrate 1502 includes what will constitute an electrically conductive plate of a capacitive sensor, which plate may be fixed or non-moving with respect to other structures. The second substrate 1502 comprises one or more layers of electrically conductive, electrically semiconductive, or electrically insulated material, although at least a portion that forms the plate is electrically conductive and can maintain an electrical potential when a voltage is applied across the plate and the mesa diaphragm via a voltage source.

As illustrated in FIG. 15A, a masking layer (lithography layer) 1504 is deposited and patterned via one or more depositing and pattering processes to form a mask. The lithography layer 1504 has an opening for etching a recession into the second substrate 1502 to form a level of the stepped contour. The second substrate 1502 is similar to the second semiconductor substrate 1408 in FIG. 14.

As illustrated in FIG. 15B, the second substrate 1502 is etched via one or more etching processes, forming the first step 1506, which is the step that faces peripheral area of the mesa diaphragm, similar to 1424 in FIG. 14. The first step 1506 is similar to the highest level step 1424 in FIG. 14. The recession formed in FIG. 15B is a portion of the second cavity 1521.

As illustrated in FIG. 15C, another masking layer (not shown) is deposited and patterned via one or more depositing and patterning processes to form a mask for etching the second step 1508 of the contour surface. The masked second substrate 1502 is further etched via one or more etching processes to form second step 1508. The second step 1508 is similar to the middle level step 1422 in FIG. 14. The recession formed in FIG. 15C is another portion of the second cavity 1521.

As illustrated in FIG. 15D, yet a further masking layer (not shown) is deposited and patterned via one or more depositing and patterning processes to form a further mask for etching the third step 1510 of the contour surface. The masked second substrate 1520 is further etched to form a third step 1510. The third step 1510 is the step that faces the central portion of the mesa diaphragm, similar to the lowest level step 1420 in FIG. 14. The recession created in FIG. 15D is a portion of the second cavity 1521. Additional masking and patterning operations may be performed depending on the total number of steps that are required to achieve a desired level of smoothness in the contour surface.

The method 1500 may include depositing or forming or growing an electrical insulation layer, for example forming or growing a layer of silicon dioxide 1512 via one or more oxidation processes. The silicon dioxide layer 1512 is similar to the second silicon dioxide layer 1410 in FIG. 14. The second cavity 1521 created in FIG. 15A-15D is included in the second substrate 1502.

As illustrated in FIG. 15E, a masking layer 1514 is deposited and patterned on the first substrate 1516 via one or more depositing and patterning processes to form a mask for etching the first cavity 1523. The first substrate 1516 is similar to or constitutes the first semiconductor substrate 1406 (FIG. 14).

As illustrated in FIG. 15F, the masked first substrate 1516 is etched to form a cavity therein. As also illustrated in FIG. 15F, an electrical insulating layer is deposited, formed or grown, for example by depositing, forming or growing a layer of silicon dioxide 1518 via one or more oxidation processes. The silicon dioxide layer 1518 is similar to the first silicon dioxide layer 1404 in FIG. 14. The first cavity 1523 is created by an etching operation of a semiconductor process to create a recess in the first substrate 1516. The first cavity 1523 created in FIG. 15F will be later extended to a bottom surface of the first substrate 1516. See FIG. 15N.

As illustrated in FIG. 15G, a layer of polysilicon layer 1520 is deposited on top of the silicon dioxide layer 1518 within the first cavity 1523, via one or more depositing processes (e.g., chemical-vapor deposition).

As illustrated in in FIG. 15F, the layer of polysilicon layer 1520 is etched via one or more etching processes. The polysilicon layer 1520 is similar to the mesa diaphragm 1402 in FIG. 14. This polysilicon layer 1520 will later become the mesa diaphragm in FIG. 15N.

As illustrated in FIG. 15H, the second silicon dioxide layer 1512 and the first silicon dioxide layer 1518 are attached or secured together, for example via thermal bonding, also known as fusion bonding. The bonding surface 1522 is covalently bonded. The first cavity 1523 is included in the first substrate 1516. The second cavity is included in the second substrate 1502, and is aligned or in registration with the first cavity 1523 when the two substrates are joined together. The dashline shown in FIG. 15H between the first cavity 1523 and the second cavity 1521 is an imaginary boundary line between the first cavity 1523 and the second cavity 1521.

As illustrated in FIG. 15I, the second substrate 1502 ground or polished to a desired thickness via one or more material removal processes (e.g., planarization, chemical-mechanical planarization).

As illustrated in FIG. 15J, a masking layer 1526 is deposited and patterned, via one or more depositing and patterning processes, to create a mask for fabricating one or more slots for electrical contacts 1528 and 1529. Electrical contact 1528 is the electrical contact for the second substrate 1502. The electrical contact 1529 is the electrical contact for the polysilicon layer 1520. The electrical contacts 1528 and 1529 may be employed to apply an electrical potential to the diaphragm (e.g., polysilicon layer 1520) and the fixed plate (e.g., the second substrate 1502) opposed across a space from the diaphragm to form a capacitor, and to couple a capacitance sensor circuit thereacross to sense a capacitance or change in capacitance and the distance between the diaphragm and fixed plate varies in response to oscillation of the diaphragm. A shallow channel may be etched in the first substrate 1502 to form the electrical contact 1528. A deep channel may be etched through the first substrate 1502 and into the second substrate 1516 to form the electrical contact 1529.

As illustrated in FIG. 15K, low temperature oxide (LTO) electrically insulative layer (e.g., silicon dioxide layer 1530) is deposited, formed or grown. This silicon dioxide layer 1530 is deposited, formed or grown, from an exterior surface of the second substrate 1502 and into the well of electrical contacts 1528 and 1529.

As illustrated in FIG. 15L, a masking layer 1531 is deposited and patterned via one or more depositing and patterning processes to form a mask for fabricating the vent holes 1536. The masked silicon dioxide layer 1530 is etched via one or more etching processes to fabricate the vent holes 1536. The vent holes 1536 are similar to, and may constitute, the vent holes 1462 in FIG. 14.

As illustrated in FIG. 15L, the silicon dioxide layer 1530 within a bottom surface of the deep well of the electrical contact 1529 is etched to expose a portion of the polysilicon layer 1520. The polysilicon layer 1520 is electrically conductive or semiconductive material. As also illustrated, a polysilicon layer 1533 is deposited into the well of electrical contact 1529 via one or more depositing processes. The polysilicon layer 1533 is in electrical contact with the polysilicon layer 1520. The dashline shown in FIG. 15L between the first cavity 1523 and the second cavity 1521 is an imaginary boundary line between the first cavity 1523 and the second cavity 1521.

As illustrated in FIG. 15M, metal layers 1532 are deposited via one or more depositing processes to form the electrical contacts 1529 and 1528. The metal layer 1532 of electrical contact 1528 is in electrical contact with the second substrate 1502. The metal layer 1532 of electrical contact 1529 is in electrical contact with the polysilicon layer 1520. The dashline shown in FIG. 15M between the first cavity 1523 and the second cavity 1521 is an imaginary boundary line between the first cavity 1523 and the second cavity 1521.

As illustrated in FIG. 15N, a masking layer (not shown) is deposited and patterned at a bottom surface of the first substrate 1516 to form a mask for fabricating another portion of the first cavity 1523. The method 1500 includes etching through the masked first substrate 1516 from the bottom surface of the first substrate 1516 up to the silicon dioxide layer 1518.

Further, the method 1500 includes etching through the silicon dioxide layer 1518 up to the polysilicon layer 1520. When the silicon dioxide layer 1518 within the first cavity 1523 is etched away, the polysilicon layer 1520 is flipped upward to form a mesa diaphragm. This flipping can be a mechanical force generated by the molecular structure of the polysilicon layer 1520 under a specific environmental condition, e.g., temperature. This process is also previously referred to in this disclosure as releasing the diaphragm (e.g., polysilicon layer 1520). The polysilicon layer 1520 in mesa formation includes all the features of the mesa diaphragm 1402 and mesa diaphragms 902.

The dashline shown in FIG. 15N between the first cavity 1523 and the second cavity 1521 is an imaginary boundary line between the first cavity 1523 and the second cavity 1521. As illustrated in FIG. 15N, the first cavity 1523 is extended to extend through an exterior of the first substrate 1516.

As illustrated in FIG. 15O, a masking layer (not shown) is deposited and patterned via one or more depositing and patterning processes to form a mask for fabricating the vent holes 1536 with the desired density distributions (δ). The method 1500 includes etching through the masked second substrate 1502 to fabricate the vent holes 1536. The method 1500 includes etching through the silicon dioxide layer 1512. The method 1500 includes forming the vent holes 1536 with the desired density distribution. In at least one embodiment, the vent holes 1536 are distributed as the embodiment in FIG. 14, having a higher vent hole density (δ) in a central area wherein the vent hole density (δ) laterally decreases toward the peripheral areas. The dashline shown in FIG. 15O between the first cavity 1523 and the second cavity 1521 is an imaginary boundary line.

The various embodiments disclosed herein include specific designs for capacitive acoustic transducer or sensor that includes an electrically conductive diaphragm and a second substrate opposed to the diaphragm across a cavity, at least a portion of the second substrate being electrically conductive. One or more dielectric materials are included in-between the diaphragm and the second substrate. In some embodiments, the diaphragm is in mesa form and the second substrate has a cavity with a non-planar contoured or structured bottom surface that faces the diaphragm that improves or even maximizes a signal to noise ratio (SNR) of a the transducer or microphone. The mesa diaphragm design provides advantageous properties such that the capacitance value (C) is independent from the thickness of isolation layers. This means increasing the isolation layer will not decrease the capacitance value (C). Therefore, thickness of isolation layers can be increased to reduce the leaking current (white noise), without compromising the capacitance value. The contoured or structured bottom surface of the cavity of the second substrate provides advantageous properties that maximize the sensitivity of the diaphragm vibrations, which translates to high SNR of the transducer or microphone.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. The various implementations and/or embodiments described above can be combined to provide further implementations and/or embodiments. There are changes that may be made without departing from the scope of the claims set forth below. These and other changes can be made to the implementations and/or embodiments in light of the above-detailed description. In general, in the following claims, the terms used should not be construed to limit the claims to the specific implementations and/or embodiments disclosed in the specification and the claims, but should be construed to include all possible implementations and/or embodiments along with the full scope of equivalents to which such claims are entitled. Accordingly, the claims are not limited by the disclosure.

What is claimed:

1. A method to fabricate a capacitive micro-electromechanical transducer, the method comprising:
    forming a mesa diaphragm in a layer of a first substrate, the mesa diaphragm spanning a first cavity in at least a second layer of the first substrate, the first cavity open at an exterior surface of the first substrate, the exterior surface opposed to an interior surface of the first substrate;
    providing a second substrate having an interior surface, an exterior surface, and a second cavity formed in the interior surface of the second substrate, the second cavity having a second opening and terminating in a cavity bottom surface, the cavity bottom surface being non-planar across at least one lateral or radial dimension thereof;
    attaching the interior surface of second substrate to the interior surface of the first substrate with the mesa diaphragm in registration with the second cavity and with the mesa diaphragm oscillatable along a longitudinal axis at least partially into the second cavity.

2. The method of claim 1, further comprising:
    patterning the cavity bottom surface.

3. The method of claim 2 wherein patterning the cavity bottom surface includes forming a plurality of stepped regions, a depth of the second cavity as measured from the second opening to the cavity bottom surface increases as the cavity bottom surface is laterally or radially traversed from a perimeter thereof to a center thereof.

4. The method of claim 1, further comprising:
    forming a plurality of holes in the second substrate that extend from the cavity bottom surface through the exterior surface of the second substrate.

5. The method of claim 4 wherein forming a plurality of holes in the second substrate includes forming the plurality of holes which are non-uniform in at least one of size or distribution, where a relative density of the holes or a relative size of the holes increasing as the cavity bottom surface is laterally or radially traversed from a perimeter thereof to a center thereof.

6. The method of claim 4 wherein forming a plurality of holes in the second substrate includes forming the plurality of holes which are uniform in size a lateral dimension, and a density of the holes is higher at a center than at a perimeter of the cavity bottom surface.

7. The method of claim 1, further comprising:
    forming at least one vent in at least one of the first or the second substrates that extends laterally from the second cavity to an exterior of at least one of the first or the second substrates to vent a chamber formed by the second cavity and the mesa diaphragm when the first and the second substrates are attached together.

8. The method of claim 1 wherein attaching the interior surface of second substrate to the interior surface of the first substrate includes fusion bonding the interior surface of second substrate to the interior surface of the first substrate.

9. A method to fabricate a capacitive micro-electromechanical transducer, the method comprising:
    forming a mesa diaphragm in a layer of a first substrate, the mesa diaphragm spanning a first cavity in at least a second layer of the first substrate, the first cavity open at an exterior surface of the first substrate, the exterior surface opposed to an interior surface of the first substrate;
    providing a second substrate having an interior surface, an exterior surface, and a second cavity formed in the interior surface of the second substrate, the second cavity having a second opening and terminating in a cavity bottom surface, the cavity bottom surface being non-planar across at least one lateral or radial dimension thereof;
    attaching the interior surface of second substrate to the interior surface of the first substrate with the mesa diaphragm in registration with the second cavity and with the mesa diaphragm oscillatable along a longitudinal axis at least partially into the second cavity; and
    patterning the cavity bottom surface, which includes forming a plurality of stepped regions such that a depth of the second cavity as measured from the second opening to the cavity bottom surface increases as the cavity bottom surface is laterally or radially traversed from a perimeter thereof to a center thereof.

10. The method of claim 9, further comprising:
    forming a plurality of holes in the second substrate that extend from the cavity bottom surface through the exterior surface of the second substrate.

11. The method of claim 10 wherein forming a plurality of holes in the second substrate includes forming the plurality of holes which are non-uniform in at least one of size or distribution, where a relative density of the holes or a relative size of the holes increasing as the cavity bottom surface is laterally or radially traversed from a perimeter thereof to a center thereof.

12. The method of claim 10 wherein forming a plurality of holes in the second substrate includes forming the plurality of holes which are uniform in size a lateral dimension, and a density of the holes is higher at a center than at a perimeter of the cavity bottom surface.

13. The method of claim 9, further comprising:
    forming at least one vent in at least one of the first or the second substrates that extends laterally from the second cavity to an exterior of at least one of the first or the second substrates to vent a chamber formed by the second cavity and the mesa diaphragm when the first and the second substrates are attached together.

14. The method of claim 9 wherein attaching the interior surface of second substrate to the interior surface of the first substrate includes fusion bonding the interior surface of second substrate to the interior surface of the first substrate.

15. A method to fabricate a capacitive micro-electromechanical transducer, the method comprising:
    forming a mesa diaphragm in a layer of a first substrate, the mesa diaphragm spanning a first cavity in at least a second layer of the first substrate, the first cavity open at an exterior surface of the first substrate, the exterior surface opposed to an interior surface of the first substrate;
    providing a second substrate having an interior surface, an exterior surface, and a second cavity formed in the interior surface of the second substrate, the second cavity having a second opening and terminating in a cavity bottom surface, the cavity bottom surface being non-planar across at least one lateral or radial dimension thereof;

attaching the interior surface of second substrate to the interior surface of the first substrate with the mesa diaphragm in registration with the second cavity and with the mesa diaphragm oscillatable along a longitudinal axis at least partially into the second cavity; and forming a plurality of holes in the second substrate that extend from the cavity bottom surface through the exterior surface of the second substrate, such that the plurality of holes are non-uniform in at least one of size or distribution, and such that a relative density of the holes or a relative size of the holes increases as the cavity bottom surface is laterally or radially traversed from a perimeter thereof to a center thereof.

16. The method of claim 15, further comprising:
patterning the cavity bottom surface.

17. The method of claim 16 wherein patterning the cavity bottom surface includes forming a plurality of stepped regions, a depth of the second cavity as measured from the second opening to the cavity bottom surface increases as the cavity bottom surface is laterally or radially traversed from a perimeter thereof to a center thereof.

18. The method of claim 15, further comprising:
forming at least one vent in at least one of the first or the second substrates that extends laterally from the second cavity to an exterior of at least one of the first or the second substrates to vent a chamber formed by the second cavity and the mesa diaphragm when the first and the second substrates are attached together.

19. The method of claim 15 wherein attaching the interior surface of second substrate to the interior surface of the first substrate includes fusion bonding the interior surface of second substrate to the interior surface of the first substrate.

20. A method to fabricate a capacitive micro-electromechanical transducer, the method comprising:

forming a mesa diaphragm in a layer of a first substrate, the mesa diaphragm spanning a first cavity in at least a second layer of the first substrate, the first cavity open at an exterior surface of the first substrate, the exterior surface opposed to an interior surface of the first substrate;

providing a second substrate having an interior surface, an exterior surface, and a second cavity formed in the interior surface of the second substrate, the second cavity having a second opening and terminating in a cavity bottom surface, the cavity bottom surface being non-planar across at least one lateral or radial dimension thereof; and attaching the interior surface of second substrate to the interior surface of the first substrate with the mesa diaphragm in registration with the second cavity and with the mesa diaphragm oscillatable along a longitudinal axis at least partially into the second cavity;

forming a plurality of holes in the second substrate that extend from the cavity bottom surface through the exterior surface of the second substrate, such that the plurality of holes are uniform in size, and a density of the holes is higher at a center of the cavity bottom surface than at a perimeter of the cavity bottom surface.

21. The method of claim 20, further comprising:
patterning the cavity bottom surface.

22. The method of claim 21 wherein patterning the cavity bottom surface includes forming a plurality of stepped regions, a depth of the second cavity as measured from the second opening to the cavity bottom surface increases as the cavity bottom surface is laterally or radially traversed from a perimeter thereof to a center thereof.

23. The method of claim 20, further comprising:
forming at least one vent in at least one of the first or the second substrates that extends laterally from the second cavity to an exterior of at least one of the first or the second substrates to vent a chamber formed by the second cavity and the mesa diaphragm when the first and the second substrates are attached together.

24. The method of claim 20 wherein attaching the interior surface of second substrate to the interior surface of the first substrate includes fusion bonding the interior surface of second substrate to the interior surface of the first substrate.

25. The method of claim 1 wherein attaching the interior surface of second substrate to the interior surface of the first substrate includes fluidically connecting the first cavity and the second cavity.

* * * * *